(12) United States Patent
Tanabe et al.

(10) Patent No.: US 8,709,299 B2
(45) Date of Patent: Apr. 29, 2014

(54) DYE SENSITISED SOLAR CELL

(75) Inventors: Junichi Tanabe, Mannheim (DE);
Hiroshi Yamamoto, Nishinomiya (JP);
Shinji Nakamichi, Osaka (JP); Ryuichi Takahashi, Kobe (JP)

(73) Assignee: BASF SE, Ludwigshafen (DE)

( * ) Notice: Subject to any disclaimer, the term of this patent is extended or adjusted under 35 U.S.C. 154(b) by 129 days.

(21) Appl. No.: 13/391,838

(22) PCT Filed: Aug. 27, 2010

(86) PCT No.: PCT/EP2010/062567
§ 371 (c)(1),
(2), (4) Date: Feb. 23, 2012

(87) PCT Pub. No.: WO2011/026797
PCT Pub. Date: Mar. 10, 2011

(65) Prior Publication Data
US 2012/0145238 A1    Jun. 14, 2012

(30) Foreign Application Priority Data
Sep. 4, 2009 (EP) .................................. 09169444

(51) Int. Cl.
*H01B 1/00* (2006.01)
*H01L 31/00* (2006.01)
*H01L 21/00* (2006.01)
*C07D 213/00* (2006.01)
*H01L 29/08* (2006.01)

(52) U.S. Cl.
USPC .............. 252/518.1; 136/263; 438/82; 546/1; 257/40

(58) Field of Classification Search
USPC .................. 252/500–521.6; 136/252; 438/82; 546/1; 257/40
See application file for complete search history.

(56) References Cited

U.S. PATENT DOCUMENTS

| 4,769,292 A | 9/1988 | Tang et al. |
| 2004/0187918 A1 | 9/2004 | Ikeda et al. |
| 2008/0236663 A1 | 10/2008 | Tanabe et al. |
| 2011/0061723 A1 | 3/2011 | Kunimoto et al. |

FOREIGN PATENT DOCUMENTS

| CN | 1253436 | 4/2006 |
| EP | 0 281 381 | 9/1988 |
| EP | 1 422 782 | 5/2004 |
| EP | 1 981 047 | 10/2008 |
| JP | 2005 82678 | 3/2005 |
| JP | 2007 149570 | 6/2007 |
| WO | 2009 109499 | 9/2009 |

OTHER PUBLICATIONS

Wang et al., "Photoelectric Conversion Properties of Nanocrystalline TiO2 Electrodes Sensitized with Hemicyanine Derivatives," J. Phys. Chem. B, 104, pp. 9676-9682 (2000).*
U.S. Appl. No. 13/418,989, filed Mar. 13, 2012, Koenemann, et al.
International Search Report Issued Jan. 19, 2011 in PCT/EP10/62567 Filed Aug. 27, 2010.

* cited by examiner

*Primary Examiner* — Mark Kopec
*Assistant Examiner* — Jaison Thomas
(74) *Attorney, Agent, or Firm* — Oblon, Spivak, McClelland, Maier & Neustadt, L.L.P.

(57) ABSTRACT

The present invention pertains to an electrode layer comprising a porous film made of oxide semiconductor fine particles sensitized with certain methin dyes. Moreover the present invention pertains to a photoelectric conversion device comprising said electrode layer, a dye sensitized solar cell comprising said photoelectric conversion device and to novel methin dyes.

16 Claims, No Drawings

DYE SENSITISED SOLAR CELL

The present invention pertains to an electrode layer comprising a porous film made of oxide semiconductor fine particles sensitized with certain methin dyes. Moreover the present invention pertains to a photoelectric conversion device comprising said electrode layer, a dye sensitized solar cell comprising said photoelectric conversion device and to novel methin dyes.

US2004/0187918, CN-C-1253436, JP-A-2005/082678 and JP-A-2007/149570 disclose photoelectric conversion devices comprising some methine dyes.

It is the finding of the present invention that photoelectric conversion devices sensitized with certain methin dyes have excellent overall properties, in particular that they have a particularly high photo-electric power conversion efficiency.

The present invention pertains to an electrode layer comprising a porous film made of oxide semiconductor fine particles sensitized with a dye of formula (I),

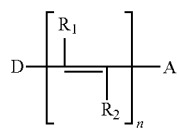
(I)

wherein
n is 1-6, preferably 1 or 2, most preferably 1;
A is a group of formula (II) or (III), preferably a group of formula (II);

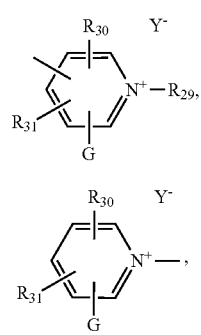

$Y^-$ is an inorganic or organic anion, preferably $Cl^-$, $Br^-$, $I^-$, $SCN^-$, $BF_4^-$, $PF_6^-$, $ClO_4^-$, $SbF_6^-$, $AsF_6^-$, $SO_3^-$ or an organic anion selected from the group consisting of carboxylate, sulphonate, sulphate, phosphate, phosphonate, more preferably $Cl^-$, $Br^-$ or $I^-$, most preferably $Br^-$;
$R_1$ and $R_2$ are independently H, $C_1$-$C_{20}$alkyl whereby the alkyl is uninterrupted or interrupted by O, S, $NR_{14}$ or combinations thereof, $C_6$-$C_{20}$aryl, $C_4$-$C_{20}$heteroaryl, or $C_6$-$C_{20}$aryl substituted by 1-3 $C_1$-$C_8$alkyl, preferably H;
or $R_1$ can additionally be D;
$R_{29}$ is $C_1$-$C_{20}$alkyl which is uninterrupted or interrupted by O, S, $NR_{14}$ or combinations thereof, $C_6$-$C_{20}$aryl, $C_4$-$C_{20}$heteroaryl, $O^-$ (for instance, if $R_{29}$ is $O^-$, $Y^-$ is not part of the compound of formula (I)), $OR_{32}$, $C_7$-$C_{20}$aralkyl, or $C_6$-$C_{20}$aryl substituted by 1-3 $C_1$-$C_8$alkyl, or $C_7$-$C_{20}$aralkyl substituted at the aryl by 1-3 $C_1$-$C_8$alkyl, preferably $R_{29}$ is $C_1$-$C_{20}$alkyl;
$R_{30}$ is G, H, $OR_{32}$, $C_1$-$C_{20}$alkyl whereby the alkyl is uninterrupted or interrupted by O, S, $NR_{14}$ or combinations thereof, $C_6$-$C_{20}$aryl, $C_4$-$C_{20}$heteroaryl, or $C_6$-$C_{20}$aryl substituted by 1-3 $C_1$-$C_8$alkyl, preferably G or H, most preferably H;
$R_{31}$ is H or

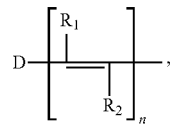

preferably H;
$R_{32}$ is $C_1$-$C_{20}$alkyl which is uninterrupted or interrupted by O, S, $NR_{14}$ or combinations thereof, $C_6$-$C_{20}$aryl, $C_4$-$C_{20}$heteroaryl, or $C_6$-$C_{20}$aryl substituted by 1-3 $C_1$-$C_8$alkyl;
G is $-R_{28}-COOH$, $-R_{28}-COO^-Z^+$; $-R_{28}-SO_3H$, $-R_{28}-SO_3^-Z^+$; $-R_{28}-OP(O)(O^-Z^+)_2$, $-R_{28}-OP(O)(OH)_2$ or $-R_{28}-OP(O)(OH)O^-Z^+$, preferably $-R_{28}-COOH$ or $-R_{28}-COO^-Z^+$, most preferably $-R_{28}-COOH$;
$R_{28}$ is a direct bond, $C_1$-$C_{20}$alkylene, $C_2$-$C_4$alkenylene or $C_6$-$C_{10}$arylene, most preferably a direct bond;
$Z^+$ is an organic or inorganic cation, preferably is $N(R_{14})_4^+$, $Li^+$, $Na^+$ or $K^+$ or is an ammonium cation which is part of a compound of formula (I) as part of group A;
D is independently a group of formula (III) or (IV), preferably a group of formula (III),

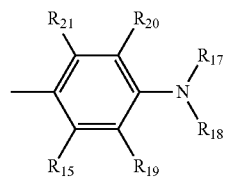

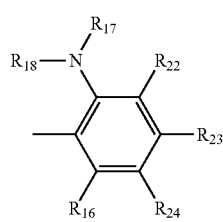

$R_{17}$ and $R_{18}$ are independently unsubstituted or substituted $C_1$-$C_{20}$alkyl, $C_2$-$C_{20}$alkenyl, $C_2$-$C_{20}$alkynyl, $C_6$-$C_{20}$aryl, $C_4$-$C_{24}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, $NR_{14}$ or combinations thereof; or $R_{17}$ and $R_{18}$, $R_{17}$ and $R_{22}$, $R_{17}$ and $R_{20}$ and/or $R_{18}$ and $R_{19}$ form together an unsubstituted or substituted 5-, 6- or 7-membered ring;
$R_{15}$, $R_{16}$, $R_{19}$, $R_{20}$, $R_{21}$, $R_{22}$, $R_{23}$ and $R_{24}$ are independently H, $NR_{25}R_{26}$, $OR_{25}$, $SR_{25}$, $NR_{25}-NR_{26}R_{27}$, $NR_{25}-OR_{26}$, $O-CO-R_{25}$, $O-CO-OR_{25}$, $O-CO-NR_{25}R_{26}$, $NR_{25}-CO-R_{26}$, $NR_{25}-CO-OR_{26}$, $NR_{25}-CO-NR_{26}R_{27}$, $CO-R_{25}$, $CO-OR_{25}$, $CO-NR_{25}R_{26}$, $S-CO-R_{25}$, $CO-SR_{25}$, $CO-NR_{25}-NR_{26}R_{27}$, $CO-NR_{25}-OR_{26}$, $CO-O-CO-R_{25}$, $CO-O-CO-OR_{25}$, $CO-O-CO-NR_{25}R_{26}$, $CO-NR_{25}-CO-R_{26}$, $CO-NR_{25}-CO-OR_{26}$, or unsubstituted or substituted $C_1$-$C_{20}$alkyl, $C_6$-$C_{20}$aryl, $C_2$-$C_{20}$alkenyl, $C_2$-$C_{20}$alkynyl, $C_6$-$C_{20}$aryl, $C_4$-$C_{20}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, $NR_{14}$ or combinations thereof;

$R_{25}$, $R_{26}$ and $R_{27}$ are independently H or unsubstituted or substituted $C_1$-$C_{20}$alkyl, $C_6$-$C_{20}$aryl, $C_2$-$C_{20}$alkenyl, $C_2$-$C_{20}$alkynyl, $C_6$-$C_{20}$aryl, $C_4$-$C_{20}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, $NR_{14}$ or combinations thereof;

$R_{14}$ is H or $C_1$-$C_{20}$alkyl.

For instance, n is 1 or 2;

A is a group of formula (II) or (III),

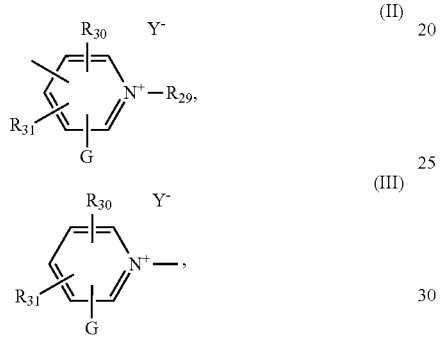

$Y^-$ is $Cl^-$, $Br^-$, $I^-$, $SCN^-$, $BF_4^-$, $PF_6^-$, $ClO_4^-$, $SbF_6^-$, $AsF_6^-$, $SO_3^-$ or an organic anion selected from the group consisting of $C_1$-$C_{20}$alkyl-$COO^-$, $C_6$-$C_{20}$aryl-$COO^-$, $C_1$-$C_{20}$alkyl-$S(=O)_2O^-$, $C_6$-$C_{20}$aryl-$S(=O)_2O^-$, $C_1$-$C_{20}$alkyl-$O$—$S(=O)_2O^-$, $C_6$-$C_{20}$aryl-$O$—$S(=O)_2O^-$, $C_1$-$C_{20}$alkyl-$P(=O)_2O^-$, $C_6$-$C_{20}$aryl-$P(=O)_2O^-$, $C_1$-$C_{20}$alkyl-$O$—$P(=O)_2O^-$ and $C_6$-$C_{20}$aryl-$O$—$P(=O)_2O^-$, whereby the aryl is unsubstituted or substituted by 1 to 4 $C_1$-$C_{20}$alkyl, or $Y^-$ is an anionic group which is part of a compound of formula (I) and is selected from the group consisting of $COO^-$, $SO_3^-$, $P(=O)(O^-)(O^-Z^+)$ or $P(=O)(OH)(O^-)$;

$R_1$ and $R_2$ are independently H, $C_1$-$C_{20}$alkyl whereby the alkyl is uninterrupted or interrupted by O, S, $NR_{14}$ or combinations thereof, $C_6$-$C_{20}$aryl, $C_4$-$C_{20}$heteroaryl, or $C_6$-$C_{20}$aryl substituted by 1-3 $C_1$-$C_8$alkyl;

or $R_1$ can additionally be D;

$R_{29}$ is $C_1$-$C_{20}$alkyl which is uninterrupted or interrupted by O, S, $NR_{14}$ or combinations thereof, $C_6$-$C_{20}$aryl, $C_4$-$C_{20}$heteroaryl, $O^-$, $OR_{32}$, $C_7$-$C_{20}$aralkyl, or $C_6$-$C_{20}$aryl substituted by 1-3 $C_1$-$C_8$alkyl, or $C_7$-$C_{20}$aralkyl substituted at the aryl by 1-3 $C_1$-$C_8$alkyl;

$R_{30}$ is G, H, $OR_{32}$, $C_1$-$C_{20}$alkyl whereby the alkyl is uninterrupted or interrupted by O, S, $NR_{14}$ or combinations thereof, $C_6$-$C_{20}$aryl, $C_4$-$C_{20}$heteroaryl, or $C_6$-$C_{20}$aryl substituted by 1-3 $C_1$-$C_8$alkyl;

$R_{31}$ is H or

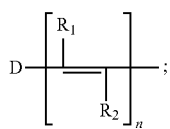

$R_{32}$ is $C_1$-$C_{20}$alkyl which is uninterrupted or interrupted by O, S, $NR_{14}$ or combinations thereof, $C_6$-$C_{20}$aryl, $C_4$-$C_{20}$heteroaryl, or $C_6$-$C_{20}$aryl substituted by 1-3 $C_1$-$C_8$alkyl;

G is —$R_{28}$—COOH, —$R_{28}$—$COO^-Z^+$; —$R_{28}$—$SO_3H$, —$R_{28}$—$SO_3^-Z^+$; —$R_{28}$—$OP(O)(O^-Z^+)_2$, —$R_{28}$—$OP(O)(OH)_2$ or —$R_{28}$—$OP(O)(OH)O^-Z^+$;

$R_{28}$ is a direct bond, $C_1$-$C_{20}$alkylene, $C_2$-$C_4$alkenylene or $C_6$-$C_{10}$arylene;

$Z^+$ is $N(R_{14})_4^+$, $Li^+$, $Na^+$ or $K^+$ or is the cationic group

which is part of a compound of formula (I) as part of group A;

D is independently a group of formula (III) or (IV),

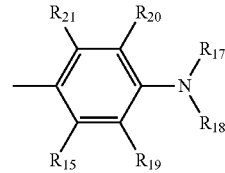

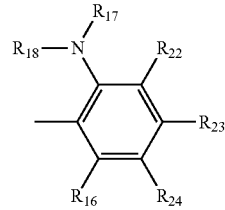

$R_{17}$ and $R_{18}$ are independently fluorenyl, $C_1$-$C_{20}$alkyl, $C_2$-$C_{20}$alkenyl, $C_2$-$C_{20}$alkynyl, $C_6$-$C_{20}$aryl, $C_4$-$C_{24}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the fluorenyl, alkyl and cycloalkyl are uninterrupted or interrupted by O, S, $NR_{14}$ or combinations thereof, and whereby the alkyl, alkenyl, alkynyl, aryl, heteroaryl, aralkyl, aralkenyl, aralkynyl, cycloalkyl, cycloalkenyl and cycloalkynyl are unsubstituted or substituted by tetrahydrofuranyl, halogen, S—$R_{14}$, O—$R_{14}$, CO—$OR_{14}$, O—CO—$R_{14}$, $NR_{14}R_{14}'$, $CONR_{14}R_{14}'$, $NR_{14}$—CO—$R_{14}'$, $S(=O)_2OR_{14}$, $S(=O)_2O^-Z^+$ or combinations thereof, and the fluorenyl, aryl and heteroaryl can be further substituted by maleic anhydridyl, maleimidyl, indenyl, $C_1$-$C_{20}$alkyl, $C_2$-$C_{20}$alkenyl, $C_2$-$C_{20}$alkynyl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl, $C_6$-$C_{20}$cycloalkynyl or combinations thereof, whereby the maleic anhydridyl and maleimidyl are unsubstituted or substituted by $C_1$-$C_{20}$alkyl, $C_6$-$C_{20}$aryl, phenyl-$NR_{14}R_{14}'$ or combinations thereof;

or $R_{17}$ and $R_{18}$ form together with the N they are attached to piperidinyl, piperazinyl, morpholinyl, imidazolidinyl or pyrrollidinyl, each of which is unsubstituted or substituted by $C_1$-$C_{20}$alkyl, $C_1$-$C_{20}$alkylidene, benzo, trimethylene, tetramethylene or combinations thereof, which are unsubstituted or substituted by halogen, S—$R_{14}$, O—$R_{14}$, CO—$OR_{14}$, O—CO—$R_{14}$, $NR_{14}R_{14}'$, $CONR_{14}R_{14}'$, $NR_{14}$—CO—$R_{14}'$, $S(=O)_2OR_{14}$, $S(=O)_2O^-Z^+$ or combinations thereof;

or $R_{17}$ and $R_{22}$, $R_{17}$ and $R_{20}$ and/or $R_{18}$ and $R_{19}$ form together with the N-atom $R_{17}$ and $R_{18}$ are attached to

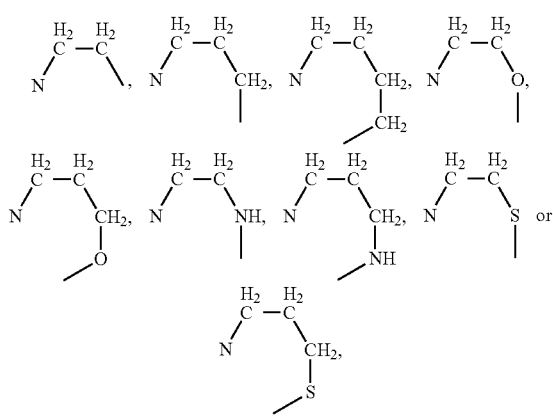

whereby in each of said groups one or more H-atom can be replaced by $C_1$-$C_{20}$alkyl, $C_1$-$C_{20}$alkylidene, phenyl or combinations thereof, in each of said groups two geminal H-atom can be replaced by $C_1$-$C_{20}$alkylidene, and/or in each of said groups two vicinal H-atoms can be replaced by benzo, trimethylene or tetramethylene, whereby the benzo is unsubstituted or substituted by methyl(fluoren-9-ylidene);

$R_{15}$, $R_{16}$, $R_{19}$, $R_{20}$, $R_{21}$, $R_{22}$, $R_{23}$ and $R_{24}$ are independently H, $NR_{25}R_{26}$, $OR_{25}$, $SR_{25}$, $NR_{25}$—$NR_{26}R_{27}$, $NR_{25}$—$OR_{26}$, O—CO—$R_{25}$, O—CO—$R_{25}$, O—CO—$NR_{25}R_{26}$, $NR_{25}$—CO—$R_{26}$, $NR_{25}$—CO—$OR_{26}$, $NR_{25}$—CO—$NR_{26}R_{27}$, CO—$R_{25}$, CO—$OR_{25}$, CO—$NR_{25}R_{26}$, CO—$SR_{25}$, CO—$NR_{25}$—$NR_{26}R_{27}$, CO—$NR_{25}OR_{26}$, CO—O—CO—$R_{25}$, CO—O—CO—$OR_{25}$, CO—O—CO—$NR_{25}R_{26}$, CO—$NR_{25}$—CO—$R_{26}$, CO—$NR_{25}$—CO—$OR_{26}$, $C_1$-$C_{20}$alkyl, $C_2$-$C_{20}$alkenyl, $C_2$-$C_{20}$alkynyl, $C_6$-$C_{20}$aryl, $C_4$-$C_{20}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, $NR_{14}$ or combinations thereof, and whereby the alkyl, alkenyl, alkynyl, aryl, heteroaryl, aralkyl, aralkenyl, aralkynyl, cycloalkyl, cycloalkenyl and cycloalkynyl are unsubstituted or substituted by halogen, S—$R_{14}$, O—$R_{14}$, CO—$OR_{14}$, O—CO—$R_{14}$, $NR_{14}R_{14}'$, $CONR_{14}R_{14}'$, $NR_{14}$—CO—$R_{14}'$, $S(=O)_2OR_{14}$, $S(=O)_2O^-Z^+$ or combinations thereof, and the aryl and heteroaryl can be further substituted by $C_1$-$C_{20}$alkyl, $C_2$-$C_{20}$alkenyl, $C_2$-$C_{20}$alkynyl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl, $C_6$-$C_{20}$cycloalkynyl or combinations thereof;

$R_{25}$, $R_{26}$ and $R_{27}$ are independently H, $C_1$-$C_{20}$alkyl, $C_6$-$C_{20}$aryl, $C_2$-$C_{20}$alkenyl, $C_2$-$C_{20}$alkynyl, $C_6$-$C_{20}$aryl, $C_4$-$C_{20}$heteroaryl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl or $C_6$-$C_{20}$cycloalkynyl, whereby the alkyl and cycloalkyl are uninterrupted or interrupted by O, S, $NR_{14}$ or combinations thereof, and whereby the alkyl, alkenyl, alkynyl, aryl, heteroaryl, aralkyl, aralkenyl, aralkynyl, cycloalkyl, cycloalkenyl and cycloalkynyl are unsubstituted or substituted by pyridinium*$Y^-$, maleic anhydridyl, maleimidyl, halogen, S—$R_{14}$, O—$R_{14}$, CO—$OR_{14}$, O—CO—$R_{14}$, $NR_{14}R_{14}'$, $CONR_{14}R_{14}'$, $NR_{14}$—CO—$R_{14}'$, $S(=O)_2OR_{14}$, $S(=O)_2O^-Z^+$ or combinations thereof, and the aryl and heteroaryl can be further substituted by $C_1$-$C_{20}$alkyl, $C_2$-$C_{20}$alkenyl, $C_2$-$C_{20}$alkynyl, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl, $C_6$-$C_{20}$cycloalkynyl or combinations thereof, whereby the pyridinium, maleic anhydridyl, maleimidyl are unsubstituted or substituted by $C_1$-$C_{20}$alkyl, $C_2$-$C_{20}$alkenyl, $C_2$-$C_{20}$alkynyl, $C_6$-$C_{20}$aryl, $C_6$-$C_{20}$aryl-O—$R_{14}$, $C_7$-$C_{20}$aralkyl, $C_8$-$C_{20}$aralkenyl, $C_8$-$C_{20}$aralkynyl, $C_4$-$C_{20}$cycloalkyl, $C_5$-$C_{20}$cycloalkenyl, $C_6$-$C_{20}$cycloalkynyl, S—$R_{14}$, O—$R_{14}$, CO—$OR_{14}$, O—CO—$R_{14}$, $NR_{14}R_{14}'$, $CONR_{14}R_{14}'$, $NR_{14}$—CO—$R_{14}'$ or combinations thereof;

$R_{14}$ and $R_{14}'$ are independently H or $C_1$-$C_{20}$alkyl.

For instance, n is 1 or 2;

A is a group of formula (IIa) or (IIb), preferably a group of formula (IIa)

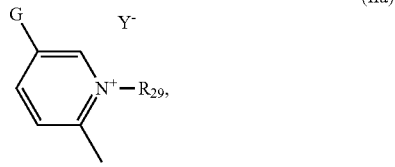

(IIa)

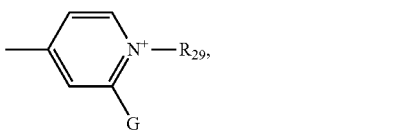

(IIb)

$Y^-$ is $Cl^-$, $Br^-$, $I^-$, $SCN^-$, $BF_4^-$, $PF_6^-$, $ClO_4^-$, $SbF_6^-$, $AsF_6^-$, $SO_3^-$ or an organic anion selected from the group consisting of $C_1$-$C_{20}$alkyl-$COO^-$, $C_6$-$C_{20}$aryl-$COO^-$, $C_1$-$C_{20}$alkyl-$S(=O)_2O^-$, $C_6$-$C_{20}$aryl-$S(=O)_2O^-$, $C_1$-$C_{20}$alkyl-O—$S(=O)_2O^-$, $C_6$-$C_{20}$aryl-O—$S(=O)_2O^-$, $C_1$-$C_{20}$alkyl-$P(=O)_2O^-$, $C_6$-$C_{20}$aryl-$P(=O)_2O^-$, $C_1$-$C_{20}$alkyl-O—$P(=O)_2O^-$ and $C_6$-$C_{20}$aryl-O—$P(=O)_2O^-$, whereby the aryl is unsubstituted or substituted by 1 to 4 $C_1$-$C_{20}$alkyl, or $Y^-$ is an anionic group which is part of a compound of formula (I) and is selected from the group consisting of $COO^-$;

$R_1$ and $R_2$ are independently H, $C_1$-$C_{20}$alkyl or $C_6$-$C_{20}$aryl; or $R_1$ can additionally be D;

$R_{29}$ is $C_1$-$C_{20}$alkyl, $O^-$, O—$C_1$-$C_{20}$alkyl or $C_7$-$C_{20}$aralkyl substituted at the aryl by 1 $C_1$-$C_8$alkyl;

G is —$R_{28}$—COOH or —$R_{28}$—$COO^-Z^+$;

$R_{28}$ is a direct bond, $C_2$-$C_4$alkenylene or $C_6$arylene;

$Z^+$ is $N(R_{14})_4^+$, $Li^+$, $Na^+$ or $K^+$ or is the cationic group

which is part of a compound of formula (I) as part of group A;

D is a group of formula (III),

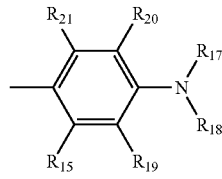

(III)

$R_{17}$ and $R_{18}$ are independently $C_1$-$C_8$alkyl, $C_2$-$C_8$alkenyl, $C_6$-$C_{20}$aryl, $C_4$-$C_{24}$heteroaryl, $C_7$-$C_{20}$aralkyl, $C_8$-$C_{20}$aralkenyl, $C_8$-$C_{10}$aralkynyl or $C_5$-$C_{12}$cycloalkyl, whereby the alkyl, alkenyl, aryl, heteroaryl, aralkyl, aralkenyl, aralkynyl and cycloalkyl, are unsubstituted or substituted by tetrahydrofuranyl, halogen, S—$R_{14}$, O—$R_{14}$, CO—$OR_{14}$, O—CO—$R_{14}$, $NR_{14}R_{14}'$, $CONR_{14}R_{14}'$, $NR_{14}$—CO—$R_{14}'$ or combinations thereof, and the aryl and heteroaryl can be further substituted by $C_1$-$C_8$alkyl, $C_2$-$C_8$alkenyl or $C_8$-$C_{20}$aralkenyl;

or $R_{17}$ and $R_{20}$ form together with the N-atom $R_{17}$ and $R_{18}$ are attached to

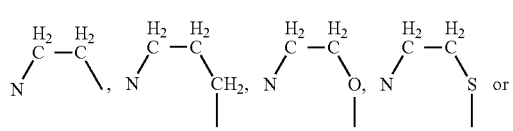

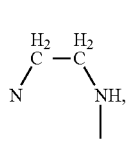

whereby in each of said groups one or more H-atom can be replaced by $C_1$-$C_{20}$alkyl, $C_6$-$C_{20}$aryl or combinations thereof, in each of said groups two geminal H-atom can be replaced by $C_1$-$C_{20}$alkylidene, and/or in each of said groups two vicinal H-atoms can be replaced by benzo, trimethylene or tetramethylene, whereby the benzo is unsubstituted or substituted by methyl(fluoren-9-ylidene);

$R_{15}$ is H, $NR_{25}R_{26}$, $OR_{25}$, $SR_{25}$, O—CO—$R_{25}$ or $NR_{25}$—CO—$R_{26}$;

$R_{19}$, $R_{20}$ and $R_{21}$ are H;

$R_{25}$ and $R_{26}$ are independently H, $C_1$-$C_{14}$alkyl, $C_6$aryl or $C_7$-$C_{10}$aralkyl, whereby the alkyl, aryl and aralkyl are unsubstituted or substituted by pyridinium*$Y^-$, halogen, S—$R_{14}$, O—$R_{14}$, CO—$OR_{14}$, O—CO—$R_{14}$, $NR_{14}R_{14}'$, $CONR_{14}R_{14}'$, $NR_{14}$—CO—$R_{14}'$ or combinations thereof, and the pyridinium and aryl can be further substituted by $C_1$-$C_8$alkyl;

$R_{14}$ and $R_{14}'$ are independently H or $C_1$-$C_{20}$alkyl.

For example, n is 1;

A is a group of formula (IIa),

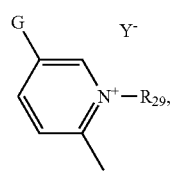

(IIa)

$Y^-$ is $Cl^-$, $Br^-$ or $I^-$, preferably $I^-$;

$R_1$ and $R_2$ are H;

$R_{29}$ is $C_1$-$C_8$alkyl, preferably methyl;

G is —$R_{28}$—COOH;

$R_{28}$ is a direct bond;

D is a group of formula (III),

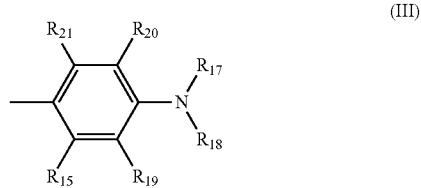

(III)

$R_{17}$ is $C_1$-$C_8$alkyl, preferably methyl;

or $R_{17}$ and $R_{20}$ form together with the N-atom $R_{17}$ and $R_{18}$ are attached to

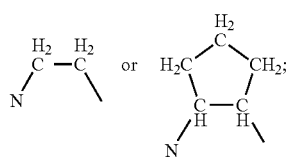

$R_{18}$ is $C_1$-$C_8$alkyl (e.g. methyl), $C_6$-$C_{24}$heteroaryl or $C_6$-$C_{20}$aryl, whereby the aryl is substituted by $C_8$-$C_{20}$aralkenyl;

$R_{15}$, $R_{19}$, $R_{20}$ and $R_{21}$ are H.

For instance, n is 1 or 2;

A is a group of formula (IIa) or (IIb), preferably a group of formula (IIa),

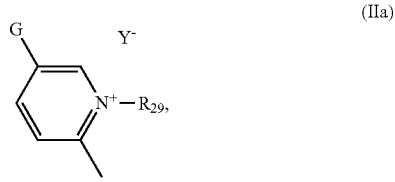

(IIa)

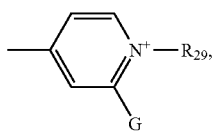

(IIb)

$Y^-$ is

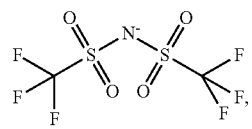

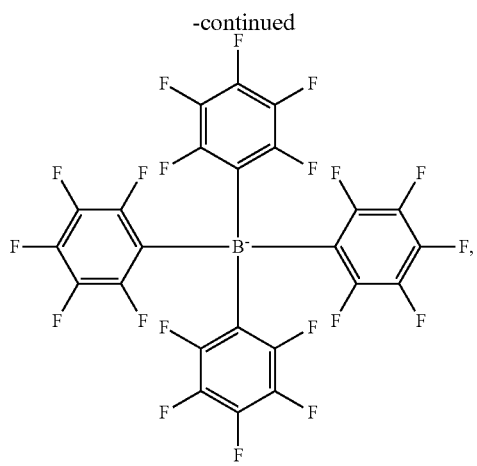

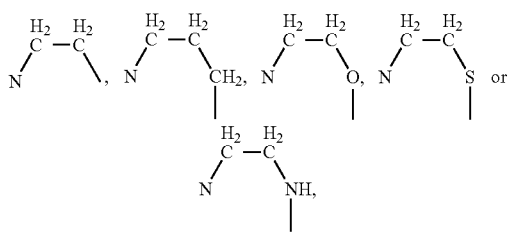

$Cl^-$, $Br^-$, $I^-$, $SCN^-$, $BF_4^-$, $PF_6^-$, $ClO_4^-$, $SbF_6^-$, $AsF_6^-$, $SO_3^-$ or an organic anion selected from the group consisting of $C_1$-$C_{20}$alkyl-$COO^-$, $C_6$-$C_{20}$aryl-$COO^-$, $C_1$-$C_{20}$alkyl-$S(=O)_2O^-$, $C_6$-$C_{20}$aryl-$S(=O)_2O^-$, $C_1$-$C_{20}$alkyl-$O$—$S(=O)_2O^-$, $C_6$-$C_{20}$aryl-$O$—$S(=O)_2O^-$, $C_1$-$C_{20}$alkyl-$P(=O)_2O^-$, $C_6$-$C_{20}$aryl-$P(=O)_2O^-$, $C_1$-$C_{20}$alkyl-$O$—$P(=O)_2O^-$ and $C_6$-$C_{20}$aryl-$O$—$P(=O)_2O^-$, whereby the aryl is unsubstituted or substituted by 1 to 4 $C_1$-$C_{20}$alkyl, or $Y^-$ is an anionic group which is part of a compound of formula (I) and is selected from the group consisting of $COO^-$;

$R_1$ and $R_2$ are independently H, $C_1$-$C_{20}$alkyl or $C_6$-$C_{20}$aryl; or $R_1$ can additionally be D;

$R_{29}$ is $C_1$-$C_{20}$alkyl, $O^-$, $O$—$C_1$-$C_{20}$alkyl or $C_7$-$C_{20}$aralkyl unsubstituted or substituted at the aryl by 1 $C_1$-$C_8$alkyl;

G is —$R_{28}$—COOH or —$R_{28}$—$COO^-Z^+$;

$R_{28}$ is a direct bond, $C_2$-$C_4$alkenylene or $C_6$arylene;

$Z^+$ is $N(R_{14})_4^+$, $Li^+$, $Na^+$ or $K^+$ or is the cationic group

which is part of a compound of formula (I) as part of group A;

D is a group of formula (III),

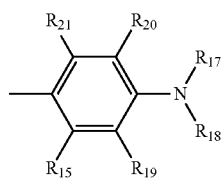

(III)

$R_{17}$ and $R_{18}$ are independently $C_1$-$C_8$alkyl, $C_2$-$C_8$alkenyl, $C_6$-$C_{20}$aryl, $C_4$-$C_{24}$heteroaryl, $C_7$-$C_{20}$aralkyl, $C_8$-$C_{20}$aralkenyl, $C_8$-$C_{10}$aralkynyl or $C_5$-$C_{12}$cycloalkyl, whereby the alkyl, alkenyl, aryl, heteroaryl, aralkyl, aralkenyl, aralkynyl and cycloalkyl, are unsubstituted or substituted by tetrahydrofuranyl, halogen, S—$R_{14}$, O—$R_{14}$, CO—$OR_{14}$, O—CO—$R_{14}$, $NR_{14}R_{14}'$, $CONR_{14}R_{14}'$, $NR_{14}$—CO—$R_{14}'$ or combinations thereof, and the aryl and heteroaryl can be further substituted by $C_1$-$C_8$alkyl, $C_2$-$C_8$alkenyl or $C_8$-$C_{20}$aralkenyl;

or $R_{17}$ and $R_{20}$ and/or $R_{18}$ and $R_{19}$ form together with the N-atom $R_{17}$ and $R_{18}$ are attached to whereby in each of said groups one or more H-atom can be replaced by $C_1$-$C_{20}$alkyl, $C_6$-$C_{20}$aryl or combinations thereof, in each of said groups two geminal H-atom can be replaced by $C_1$-$C_{20}$alkylidene, and/or in each of said groups two vicinal H-atoms can be replaced by benzo, trimethylene or tetramethylene, whereby the benzo is unsubstituted or substituted by methyl(fluoren-9-ylidene);

$R_{15}$ is H, $NR_{25}R_{26}$, $OR_{25}$, $SR_{25}$, O—CO—$R_{25}$ or $NR_{25}$—CO—$R_{26}$;

$R_{19}$, $R_{20}$ and $R_{21}$ are H;

$R_{25}$ and $R_{26}$ are independently H, $C_1$-$C_{14}$alkyl, $C_6$aryl or $C_7$-$C_{10}$aralkyl, whereby the alkyl, aryl and aralkyl are unsubstituted or substituted by pyridinium*$Y^-$, halogen, S—$R_{14}$, O—$R_{14}$, CO—$OR_{14}$, O—CO—$R_{14}$, $NR_{14}R_{14}'$, $CONR_{14}R_{14}'$, $NR_{14}$—CO—$R_{14}'$ or combinations thereof, and the pyridinium and aryl can be further substituted by $C_1$-$C_8$alkyl;

$R_{14}$ and $R_{14}'$ are independently H or $C_1$-$C_{20}$alkyl.

For example, n is 1;

A is a group of formula (IIa),

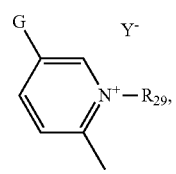

(IIa)

$Y^-$ is

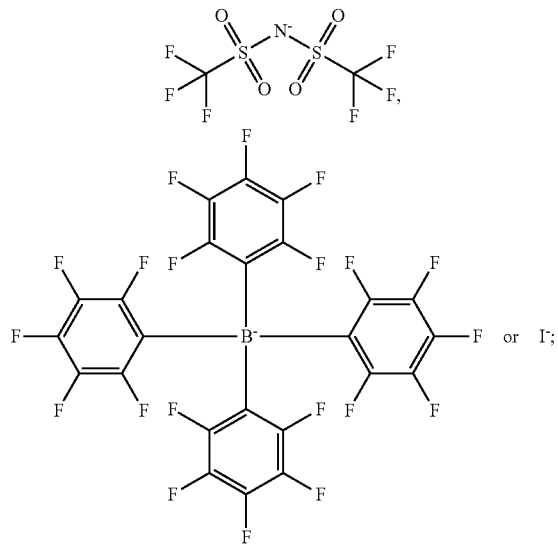

or $I^-$;

$R_1$ and $R_2$ are H;
$R_{29}$ is $C_1$-$C_{20}$alkyl or $C_7$-$C_{20}$aralkyl;
G is —$R_{28}$COOH;
$R_{28}$ is a direct bond;
D is a group of formula (III),

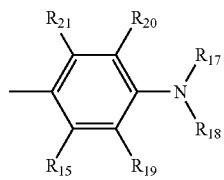
(III)

$R_{17}$ and $R_{18}$ are independently $C_1$-$C_8$alkyl, $C_6$aryl substituted by $C_8$-$C_{20}$aralkenyl or are $C_4$-$C_{24}$heteroaryl;
or $R_{17}$ and $R_{20}$ and/or $R_{18}$ and $R_{19}$ form together with the N-atom $R_{17}$ and $R_{18}$ are attached to

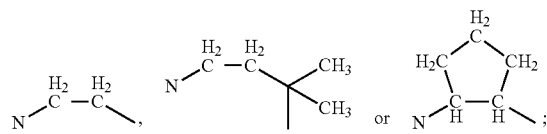

$R_{15}$ is H or $OR_{25}$;
$R_{19}$, $R_{20}$ and $R_{21}$ are H;
$R_{25}$ is $C_1$-$C_{14}$alkyl or $C_7$-$C_{10}$aralkyl.

In compounds of formula (I)

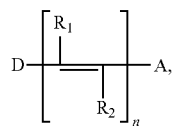
(I)

D is a donor moiety, A is an acceptor moiety and

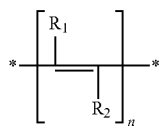

is a spacer moiety. So compounds of formula (I) contain a donor, a spacer and an acceptor.
* indicates a free valence.
Some preferred donors D are:

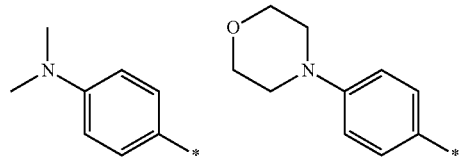

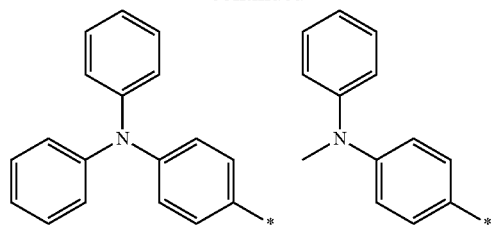

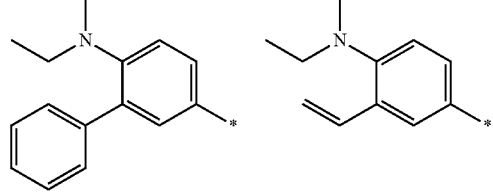

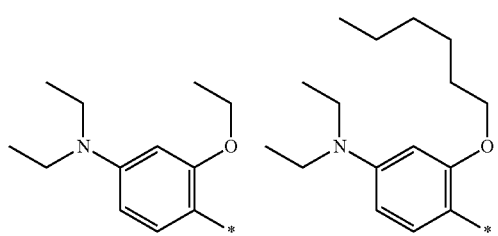

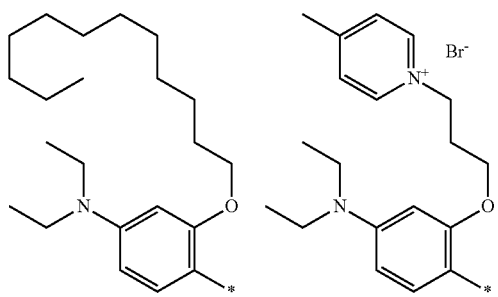

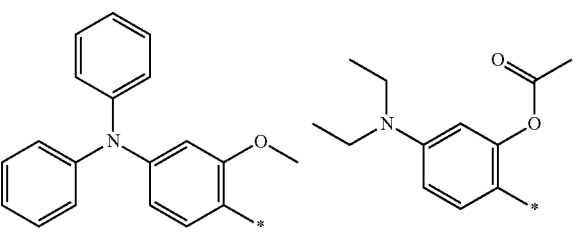

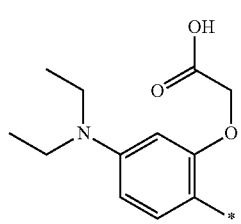

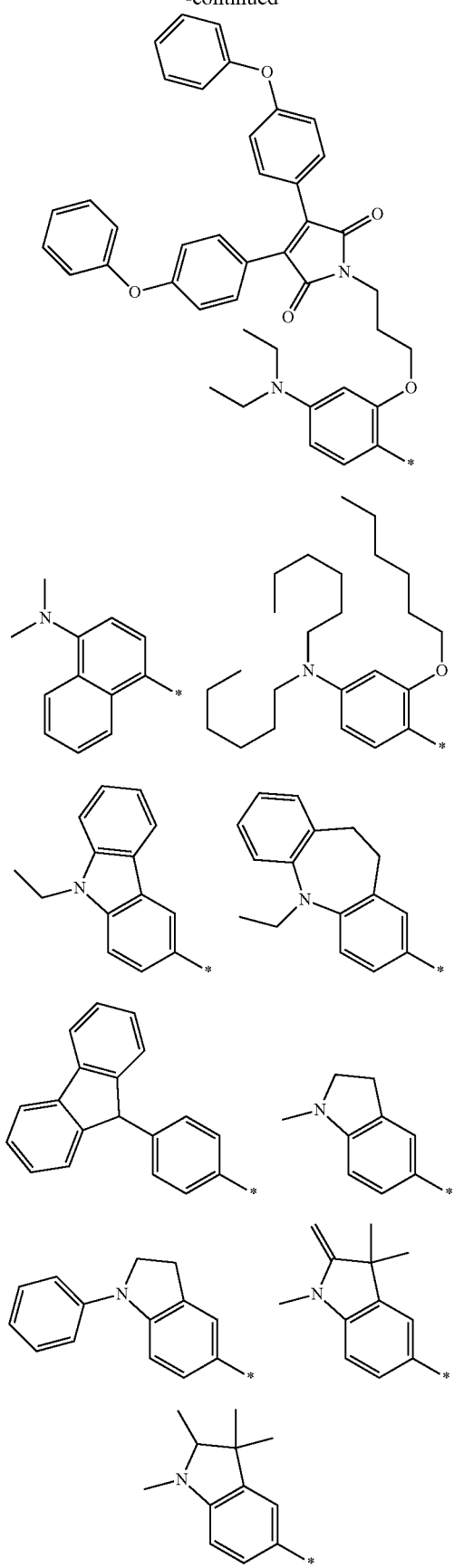
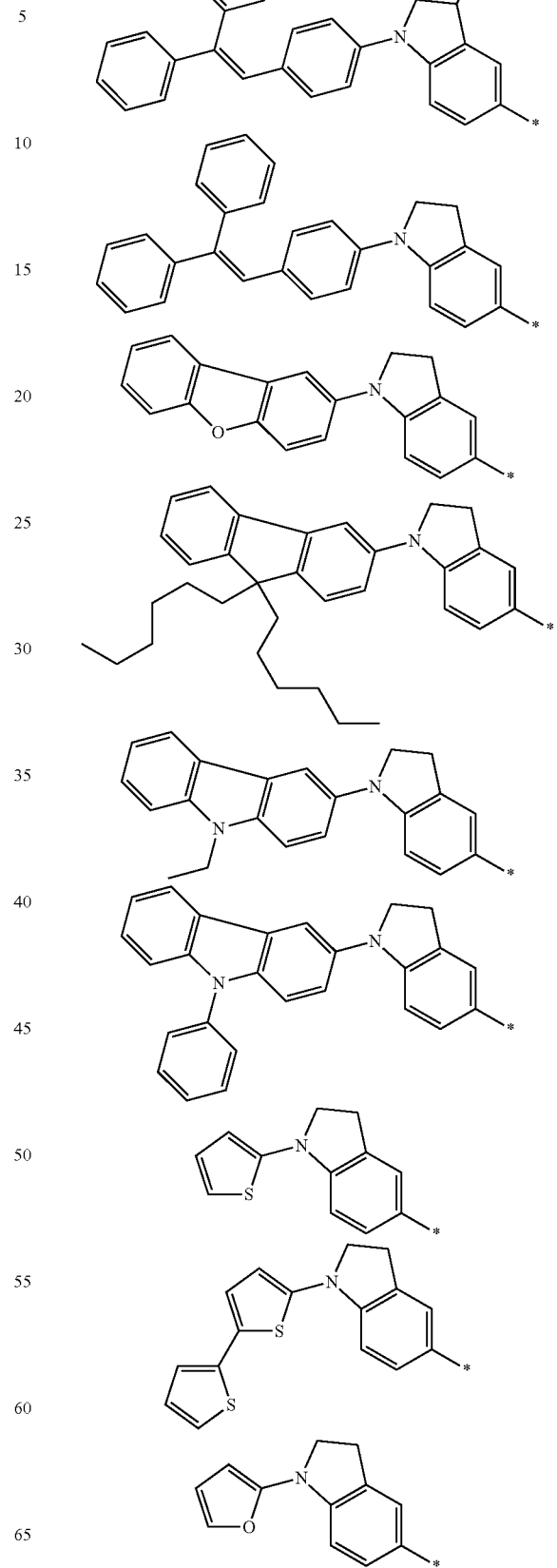

-continued
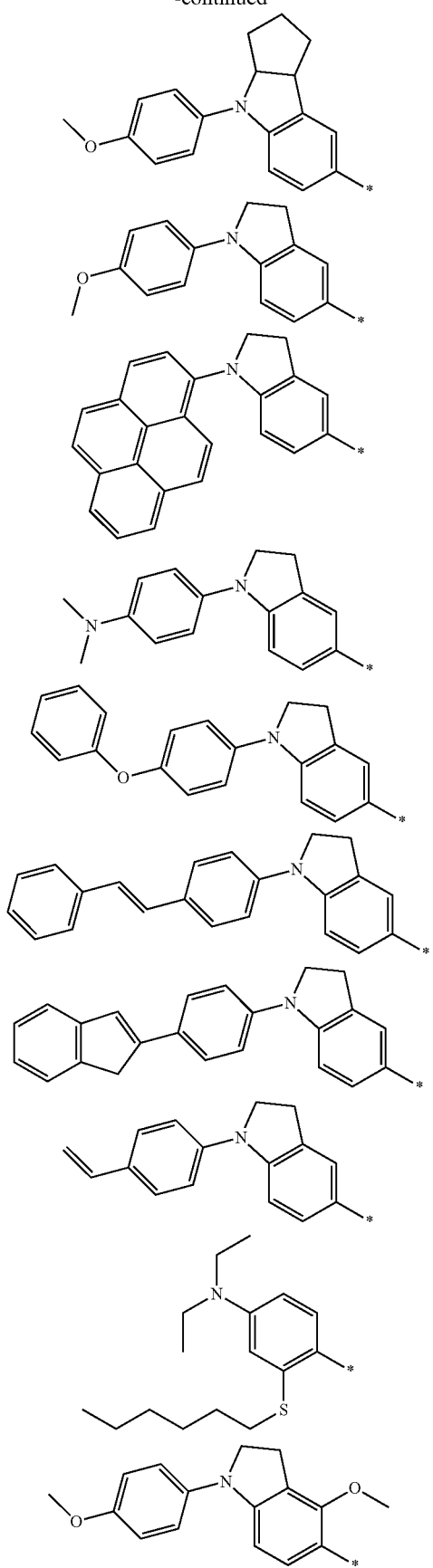
-continued
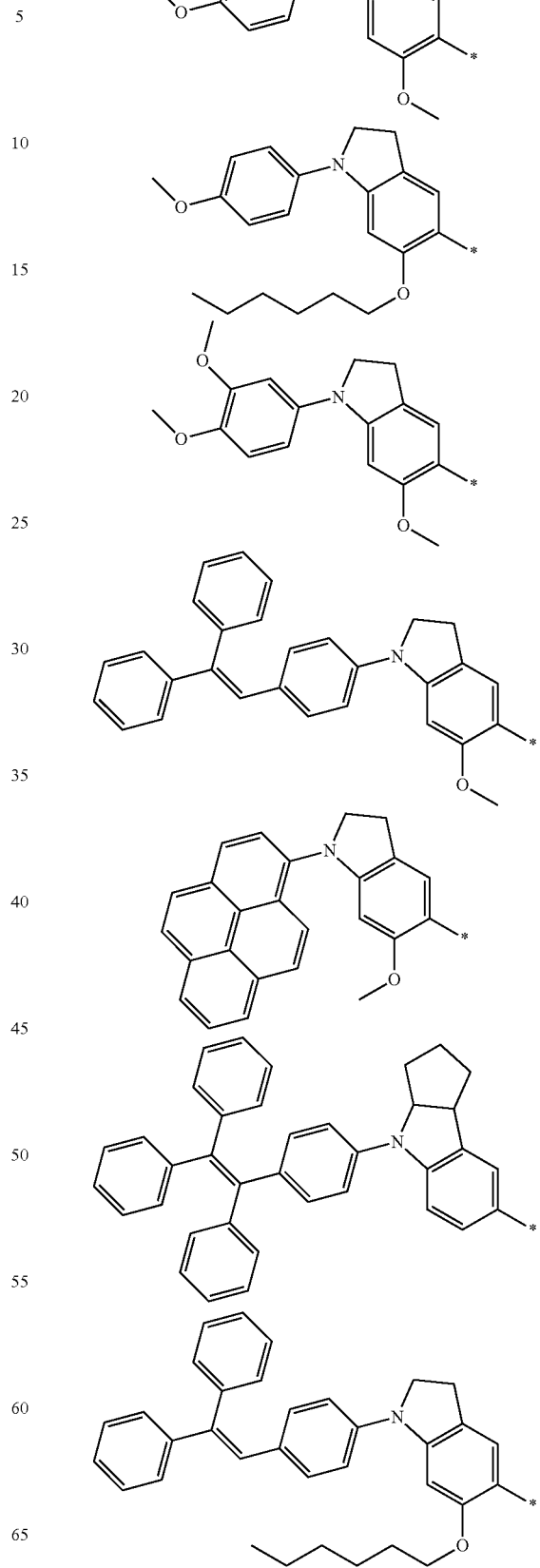

17
-continued
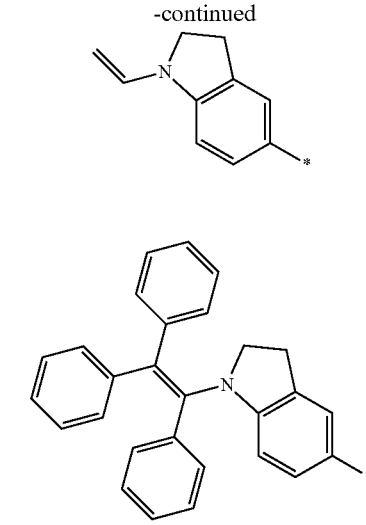
18
Some preferred dimeric donors D are
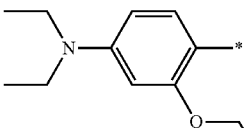
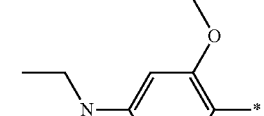
or
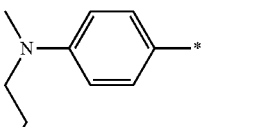
Some preferred spacers are:
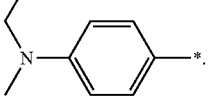
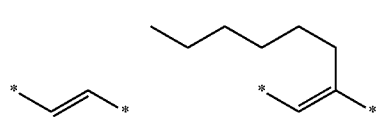
In these spacers, the donor D is preferably attached to the left side of the spacers and the acceptor A is attached to the right side of the spacer.
Some preferred acceptors A are:
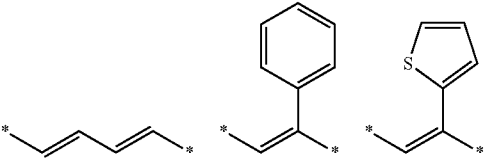
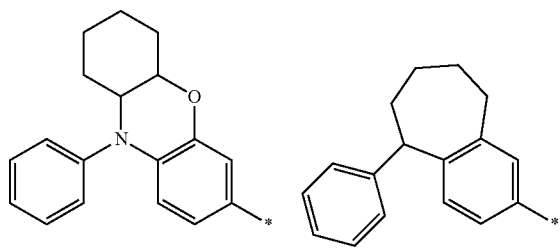
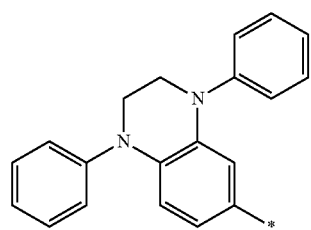

19
-continued
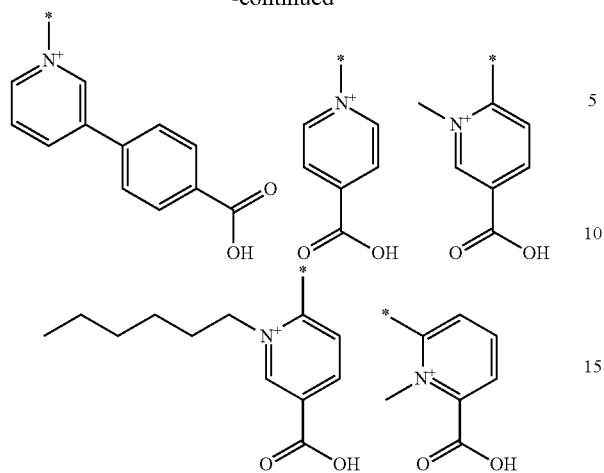
20
-continued
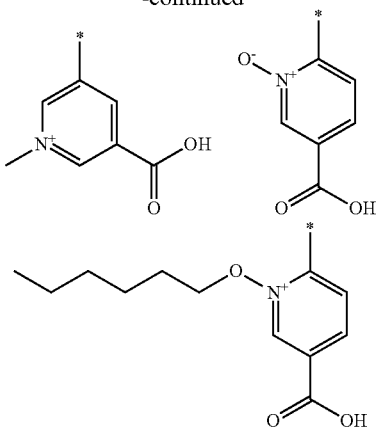
Some preferred compounds of formula (I) are:
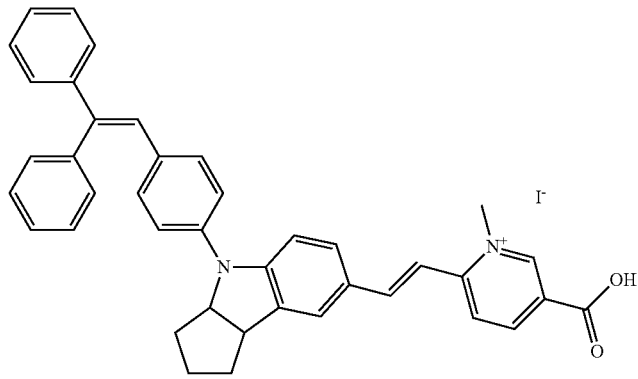 [SMILES: C[n+]1cc(C(=O)O)ccc1/C=C/c1ccc2c(c1)C1CCCC1N2c1ccc(C=C(c2ccccc2)c2ccccc2)cc1 ; [I-]]
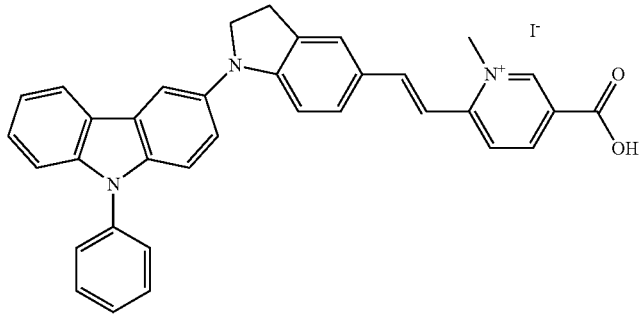 [SMILES: C[n+]1cc(C(=O)O)ccc1/C=C/c1ccc2c(c1)CCN2c1ccc2c(c1)c1ccccc1n2-c1ccccc1 ; [I-]]
| Donor | Spacer | Acceptor |
|---|---|---|
| 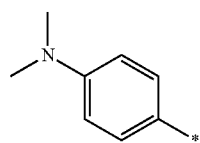 | 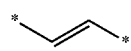 [SMILES: */C=C/*] | 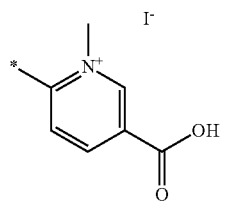 [SMILES: [I-] ; *c1ccc(C(=O)O)c[n+]1C] |
| 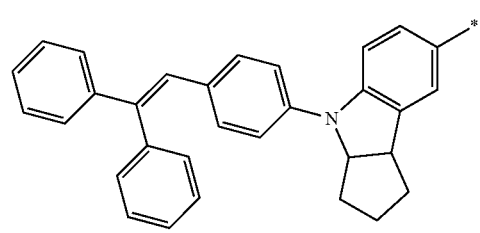 [SMILES: *c1ccc2c(c1)C1CCCC1N2c1ccc(C=C(c2ccccc2)c2ccccc2)cc1] | 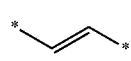 | 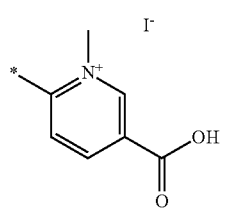 [SMILES: [I-] ; *c1ccc(C(=O)O)c[n+]1C] |

-continued
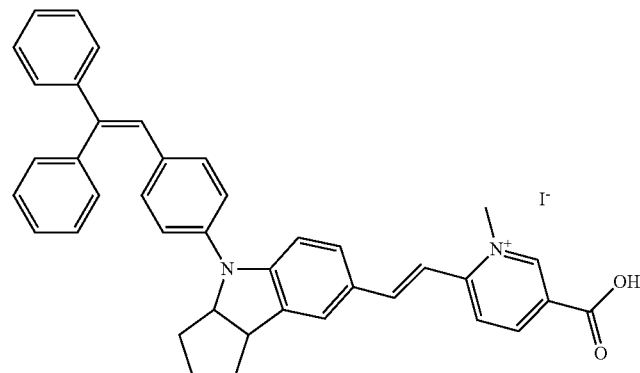
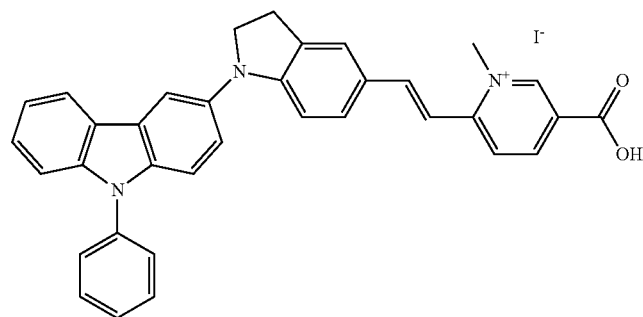
| Donor | Spacer | Acceptor |
|---|---|---|
| 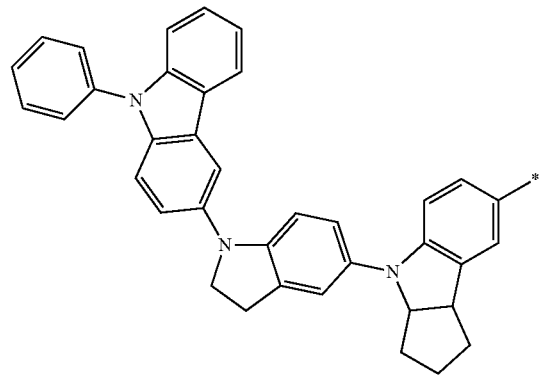 [SMILES: *c1ccc2c(c1)C1CCCC1N2c1ccc2c(c1)CCN2c1ccc2c(c1)c1ccccc1n2-c1ccccc1] | 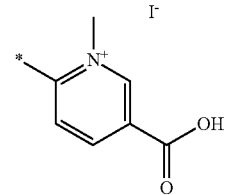 [SMILES: [I-] ; *c1ccc(C(=O)O)c[n+]1C] | 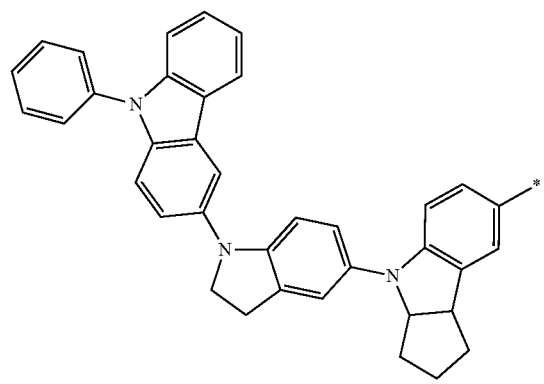 [SMILES: *c1ccc2c(c1)C1CCCC1N2c1ccc2c(c1)CCN2c1ccc2c(c1)c1ccccc1n2-c1ccccc1] |
| 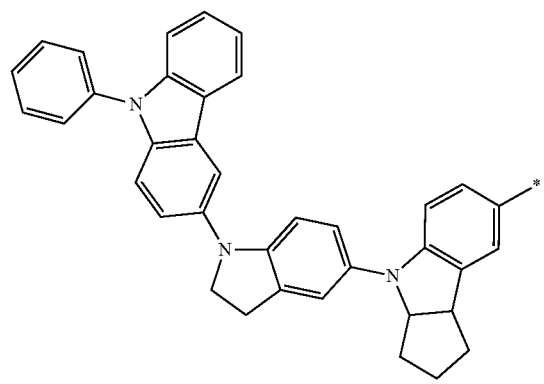 [SMILES: *c1ccc2c(c1)C1CCCC1N2c1ccc2c(c1)CCN2c1ccc2c(c1)c1ccccc1n2-c1ccccc1] | 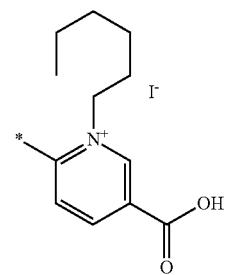 [SMILES: *c1ccc(C(=O)O)c[n+]1CCCCCC ; [I-]] | 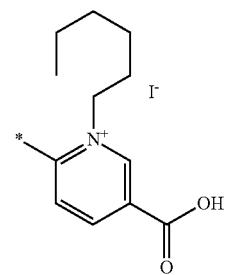 [SMILES: *c1ccc(C(=O)O)c[n+]1CCCCCC ; [I-]] |

-continued
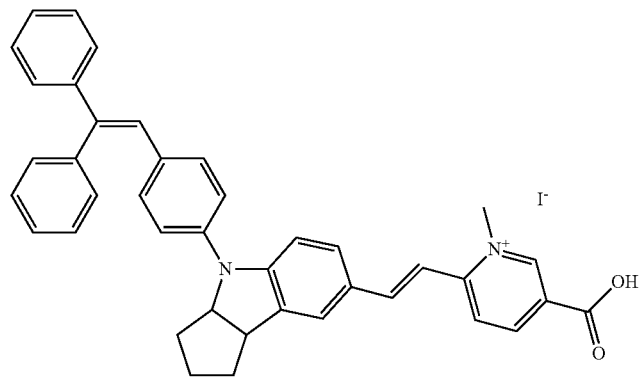
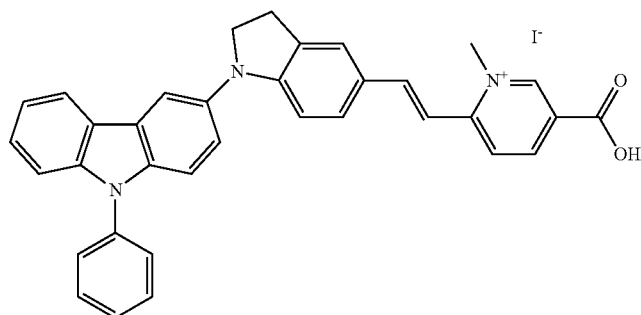
| Donor | Spacer | Acceptor |
|---|---|---|
| 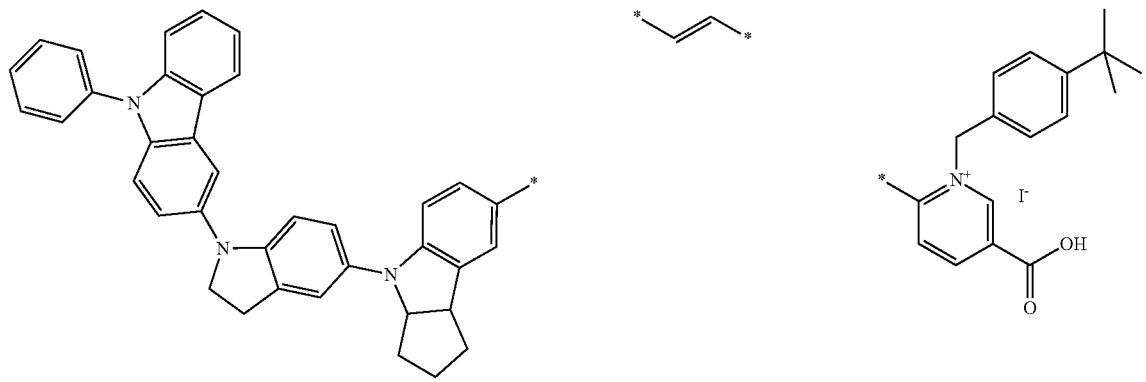 | | |
| 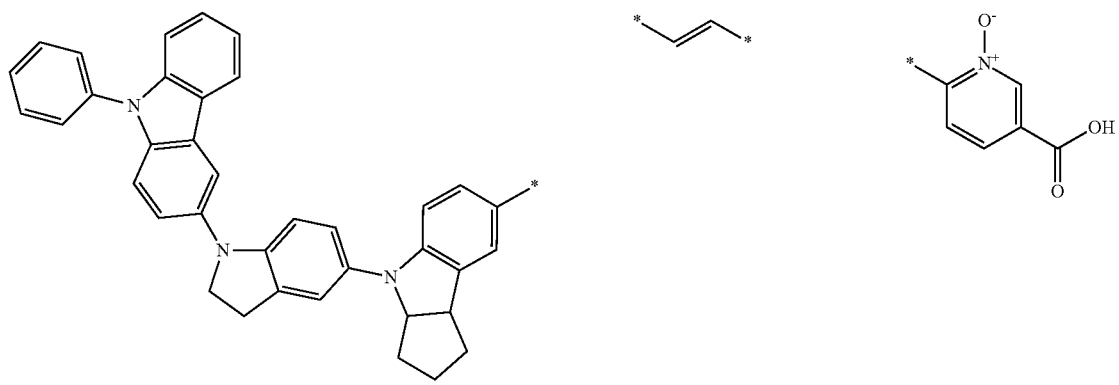 | | |

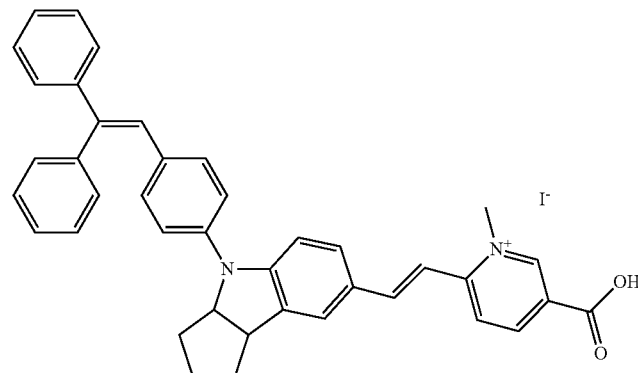
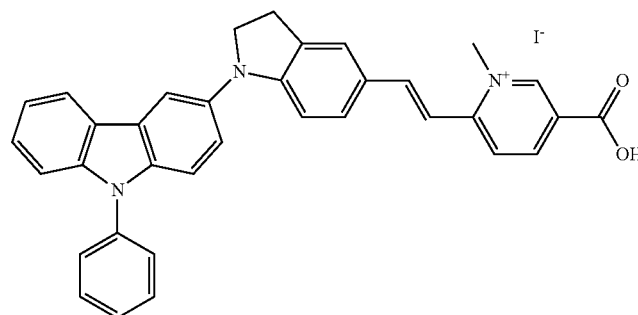
| Donor | Spacer | Acceptor |
|---|---|---|
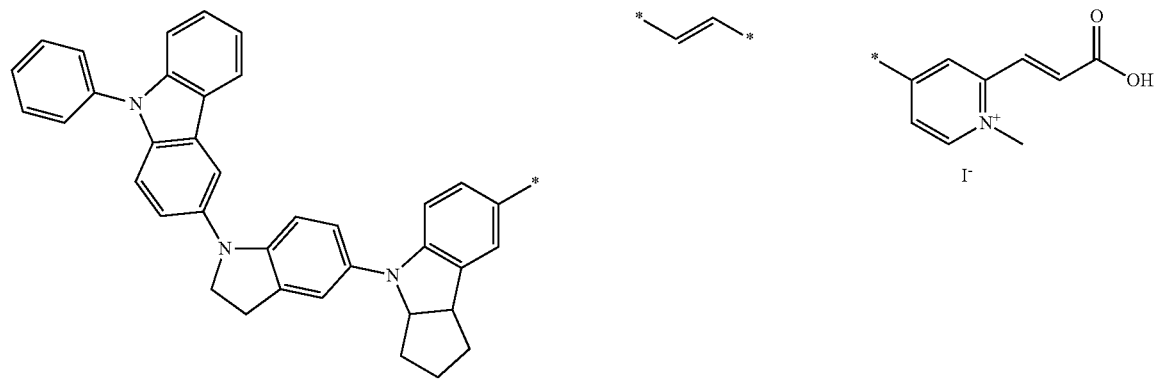
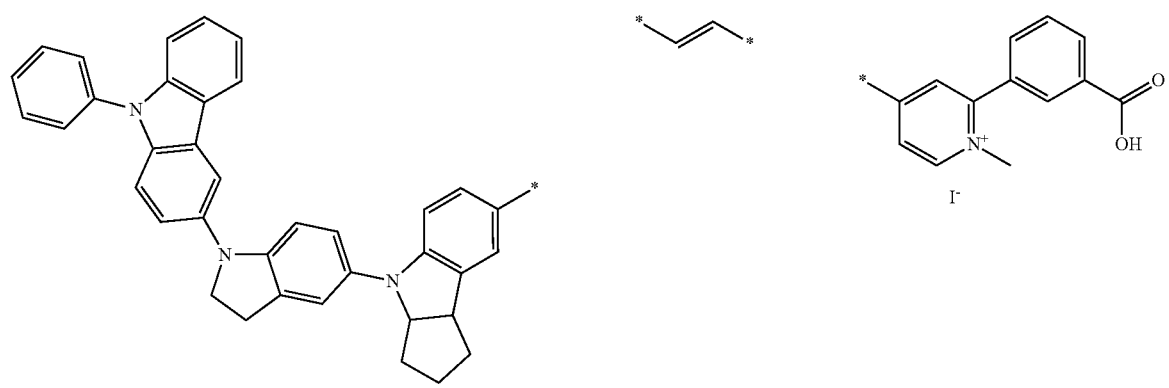

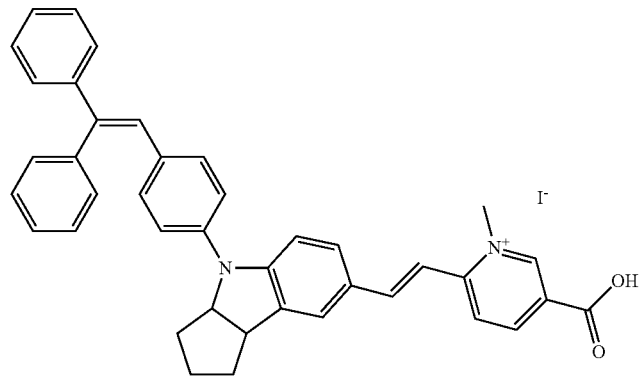
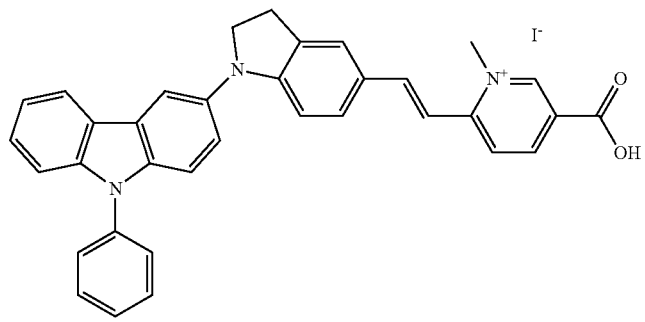
| Donor | Spacer | Acceptor |
|---|---|---|
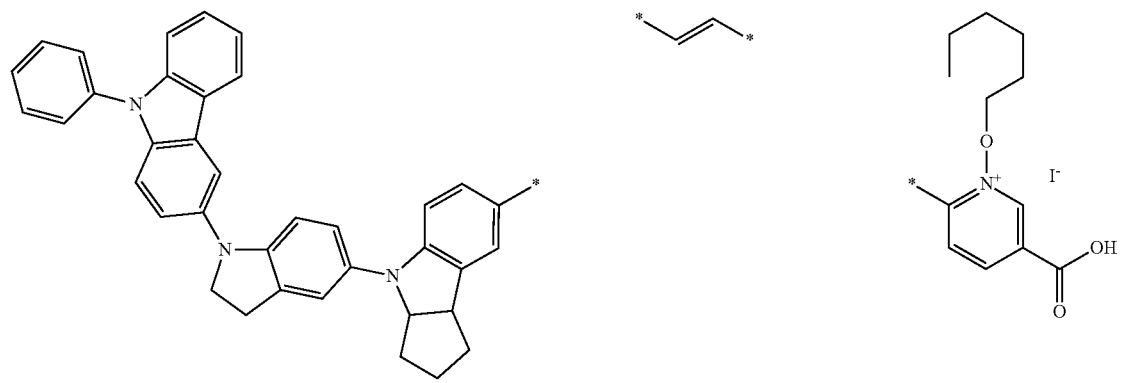
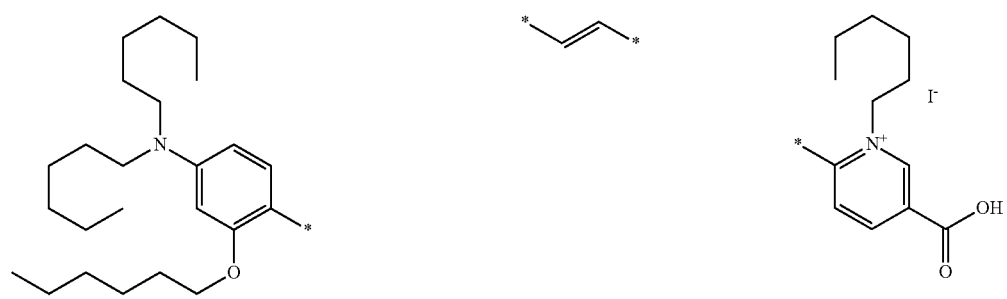

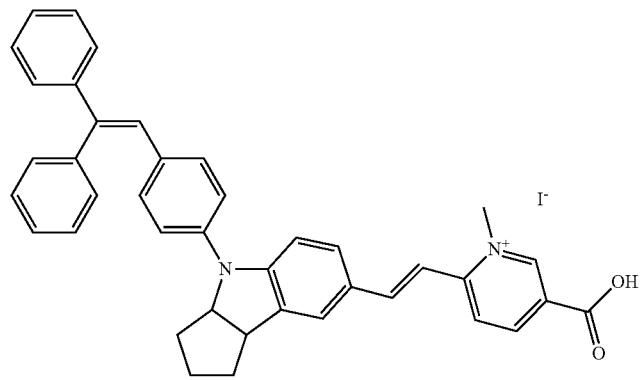
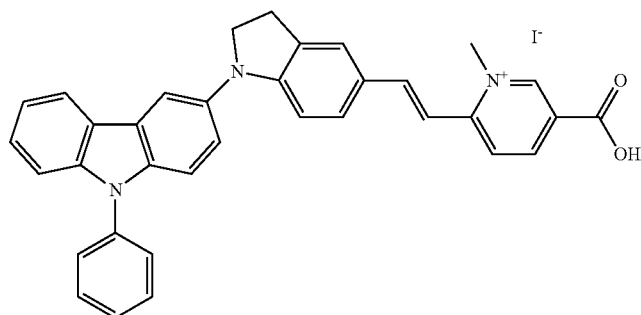
| Donor | Spacer | Acceptor |
|---|---|---|
| 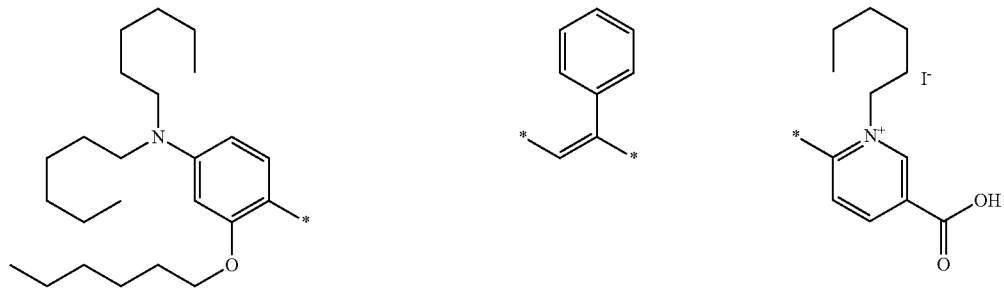 | | |
| 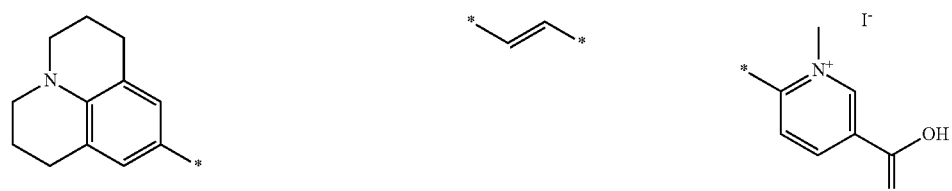 | | |
| 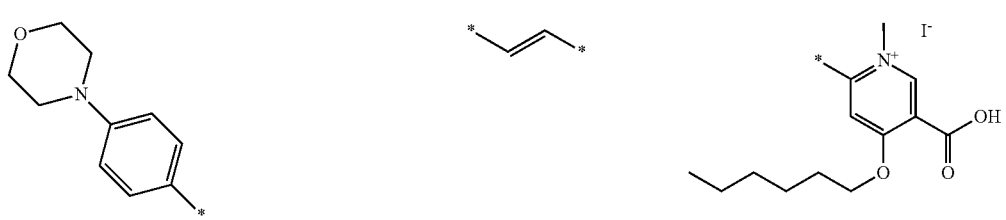 | | |

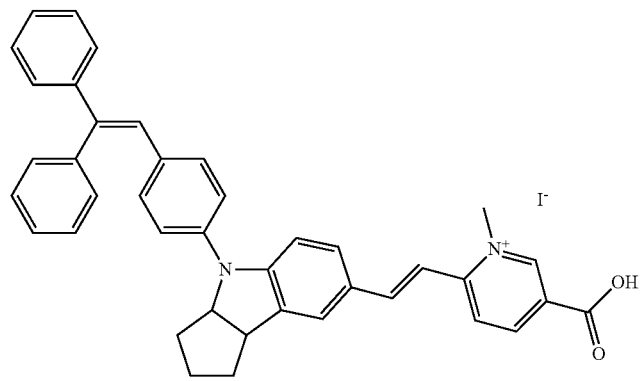

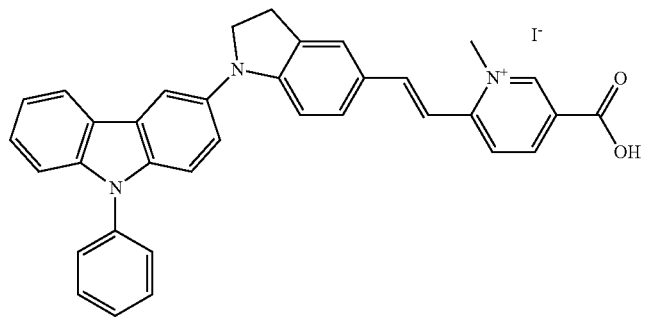

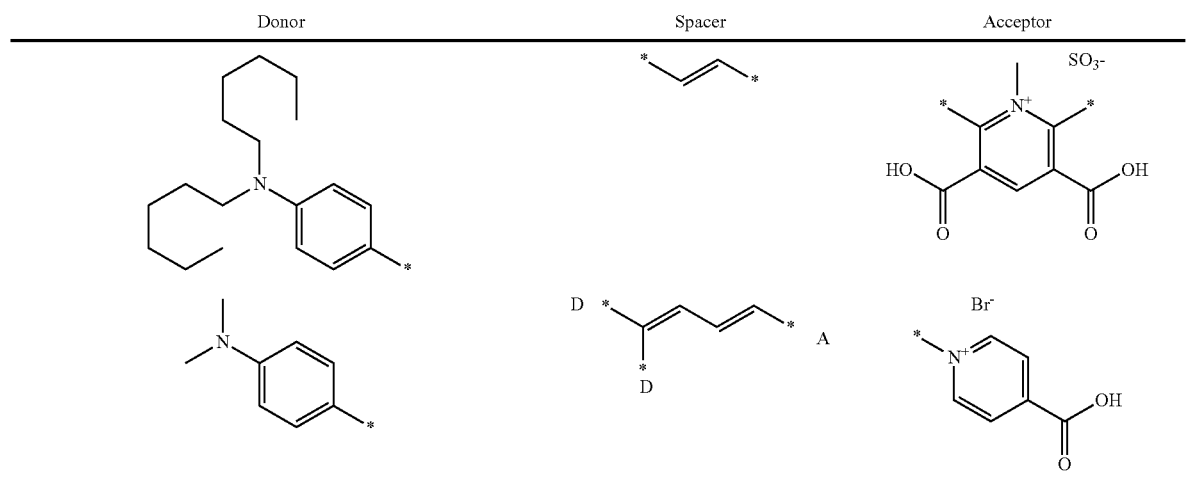

The oxide semiconductor fine particles are, for instance, made of $TiO_2$, $SnO_2$, $WO_3$, $ZnO$, $Nb_2O_5$, $Fe_2O_3$, $ZrO_2$, $MgO$, $WO_3$, $ZnO$, $CdS$, $ZnS$, $PbS$, $Bi_2S_3$, $CdSe$, $CdTe$ or combinations thereof, preferably made of $TiO_2$.

For instance, the electrode layer comprises a dye of formula (I) or a mixture of dyes of formula (I) as the only dye(s).

Preferred is a porous film made of oxide semiconductor fine particles which is sensitized with a dye of formula (I) and one or more further dyes.

Examples of further dyes are metal complex dyes (preferably the metal is Ru, Pt, Ir, Rh, Re, Os, Fe, W, Cr, Mo, Ni, Co, Mn, Zn or Cu, more preferably Ru, Os or Fe, most preferably Ru) and/or organic dyes selected from the group consisting of indoline, courmarin, cyanine, merocyanine, hemicyanine, methin, azo, quinone, quinonimine, diketo-pyrrolo-pyrrole, quinacridone, squaraine, triphenylmethane, perylene, indigo, xanthene, eosin, rhodamine and combinations thereof. As further dyes organic dyes, in particular methin dyes are preferred. For instance, the further dye is different from dyes of formula (I).

For instance, the molar ratio of a further dye to a dye of formula (I) is 1:19 to 19:1, preferably 1:9 to 9:1, more preferably 1:5 to 5:1, most preferably 1:3 to 3:1.

For example, the dye is adsorbed together with an additive, preferably a co-adsorbent.

Examples of such additives are co-adsorbents selected from the group consisting of a steroid (preferably deoxycholic acid, dehydrodeoxcholic acid, chenodeoxycholic acid, cholic acid methyl ester, cholic acid sodium salt or combinations thereof), a crown ether, a cyclodextrine, a calixarene, a polyethyleneoxide and combinations thereof, especially a steroid such as chenodeoxycholic acid.

For example, the molar ratio of such an additive to a dye of formula (I) is 1000:1 to 1:100, preferably 100:1 to 1:10, most preferably 10:1 to 1:2.

For example, such an additive is not a dye.

The present invention also pertains to a photoelectric conversion device comprising an electrode layer as defined herein.

Such photoelectric conversion devices usually comprise
(a) a transparent conductive electrode substrate layer,
(b) an electrode layer comprising a porous film made of oxide semiconductor fine particles sensitized with
(c) a dye of formula (I),
(d) a counter electrode layer, and
(e) an electrolyte layer (e.g. filled between the working electrode layer b and the counter electrode layer d).

The component (c) can also be a combination of a dye of formula (I) and one or more further dyes.

Preferably, the transparent conductive electrode substrate layer (a) contains (e.g. consists of)
(a-1) a transparent insulating layer and
(a-2) a transparent conductive layer.

The transparent conductive layer (a-2) is usually between the transparent insulating layer (a-1) and the electrode layer (b).

Examples of the transparent insulating layer (a-1) include glass substrates of soda glass, fused quartz glass, crystalline quartz glass, synthetic quartz glass; heat resistant resin sheets such as a flexible film; metal sheets, transparent plastic sheets made of polyethylene terephthalate (PET), polyethylene naphthalate (PEN), polycarbonate (PC), polyether sulfone (PES); a polished plate of a ceramic, such as titanium oxide or alumina.

Examples of transparent conductive layer (a-2) are conductive metal oxides such as ITO (indium-tin compounded oxide), IZO (indium-zinc compounded oxide), FTO (fluorine-doped tin oxide), zinc oxide doped with boron, gallium or aluminum, and niobium-doped titanium oxide. The thickness of the transparent conductive layer (a-2) is usually 0.1 to 5 μm. The surface resistance is usually below 40 ohms/sq, preferably below 20 ohms/sq.

To improve the conductivity of the transparent conductive layer (a-2), it is possible to form a metal wiring layer on it, made of for instance silver, platinum, aluminum, nickel or titanium. The area ratio of the metal wiring layer is generally within the range that does not significantly reduce the light transmittance of the transparent conductive electrode substrate layer (a). When such a metal wiring layer is used, the metal wiring layer may be provided as a grid-like, stripe-like, or comb-like pattern.

The electrode layer (b) is usually between the transparent conductive electrode substrate layer (a) and the electrolyte layer (e).

The porous film of oxide semiconductor fine particles of the electrode layer (b) can be prepared by a hydrothermal process, a sol/gel process or high temperature hydrolysis in gas phase. The fine particles usually have an average particle diameter of from 1 nm to 1000 nm. Particles with different size can be blended and can be used as either single or multi-layered porous film. The porous film of the oxide semiconductor layer (b) has usually a thickness of from 0.5 to 50 μm.

If desired, it is possible to form a blocking layer on the electrode layer (b) (usually between the surface of the electrode layer (b) and the dye (c)) and/or between the electrode layer (b) and the transparent conductive electrode substrate layer (a) to improve the performance of the electrode layer (b). An example of forming a blocking layer is immersing the electrode layer (b) into a solution of metal alkoxides such as titanium ethoxide, titanium isopropoxide and titanium butoxide, chlorides such as titanium chloride, tin chloride and zinc chloride, nitrides and sulfides and then drying or sintering the substrate. For instance, the blocking layer is made of a metal oxide (e.g. $TiO_2$, $SiO_2$, $Al_2O_3$, $ZrO_2$, MgO, $SnO_2$, ZnO, $Eu_2O_3$, and $Nb_2O_5$ or combinations thereof) or a polymer (e.g. poly(phenylene oxide-co-2-allylphenylene oxide) or poly(methylsiloxane)). Details of the preparation of such layers are described in, for example, Electrochimica Acta, 1995, 40, 643; J. Phys. Chem. B, 2003, 107, 14394; J. Am. Chem. Soc., 2003, 125, 475; Chem. Lett, 2006, 35, 252; J. Phys. Chem. B, 2006, 110, 19191; J. Phys. Chem. B, 2001, 105, 1422. The blocking layer may be applied to prevent undesired reaction. The blocking is usually dense and compact, and is usually thinner than the electrode layer (b).

Preferably, the counter electrode layer (d) contains (e.g. consists of)
(d-1) a conductive layer and
(d-2) an insulating layer.

The conductive layer (d-1) is usually between the insulating layer (d-2) and the electrolyte layer (e).

For instance, the conductive layer (d-1) contains a conductive carbon (e.g. graphite, single walled carbon nanotubes, multiwalled carbon nanotubes, carbon nanofibers, carbon fibers, grapheme or carbon black), a conductive metal (e.g. gold or platinum), a metal oxide (e.g. ITO (indium-tin compounded oxide), IZO (indium-zinc compounded oxide), FTO (fluorine-doped tinoxide), zinc oxide doped with boron, gallium or aluminum, and niobium-doped titanium oxide) or mixtures thereof.

Furthermore, the conductive layer (d-1) may be one obtained by forming a layer of platinum, carbon or the like (generally with a thickness of from 0.5 to 2,000 nm), on a thin film of a conductive oxide semiconductor, such as ITO, FTO, or the like (generally with a thickness of from 0.1 to 5 μm). The layer of platinum, carbon or the like is usually between the electrolyte layer (e) and the insulating layer (d-2).

Examples of the insulating layer (d-2) includes glass substrates of soda glass, fused quartz glass, crystalline quartz glass, synthetic quartz glass; heat resistant resin sheets such as a flexible film; metal sheets, transparent plastic sheets made of polyethylene terephthalate (PET), polyethylene naphthalate (PEN), polycarbonate (PC), polyether sulfone (PES); a polished plate of a ceramic, such as titanium oxide or alumina.

The dye (c) is usually disposed on the electrode layer (b) on that surface of the electrode layer (b) facing the electrolyte layer (e).

For adsorption of the dye (c) to the electrode layer (b), the electrode layer (b) may be immersed into a solution or a dispersion liquid of the dye. A concentration of the dye solution or dye dispersion liquid is not limited to, but preferably from 1 μM to 1M, and is preferably 10 μM to 0.1M. The time period for the dye adsorption is preferably from 10 seconds to 1000 hours, more preferably from 1 minute to 200 hours, most preferably from 1 to 10 hours. The temperature for dye adsorption is preferably from room temperature to the boiling temperature of the solvent or the dispersion liquid. The adsorption may be carried out dipping, immersing or immersing with stirring. As the stirring method, a stirrer, supersonic dispersion, a ball mill, a paint conditioner, a sand mill or the like is employed, while the stirring method shall not be limited thereto.

The solvent for dissolving or dispersing the dye (c) includes water, alcohol solvents such as methanol, ethanol, isopropyl alcohol, t-butyl alcohol, ethylene glycol and propylene glycol, ether solvents such as dioxane, diethyl ether, dimethoxyethane, tetrahydrofuran, dioxolane, t-butyl methyl ether, ethylene glycol dialkyl ether, propylene glycol monomethyl ether acetate and propylene glycol methyl ether, ketone solvents such as acetone, amide solvents such as N,N-dimethylformamide, N,N-dimethylacetamide and N-methylpyrrolidone, nitrile solvents such as acetonitrile, methoxy acetonitrile, methoxy propionitrile, propionitrile and benzonitrile, carbonate solvents such as ethylene carbonate, propylene carbonate and diethyl carbonate,
heterocyclic compounds such as 3-methyl-2-oxazolidinone, dimethyl sulfoxide, sulfolane and γ-butyrolactone, halogenated hydrocarbon solvents such as dichloromethane, chloroform, dichloroethane, trichloroethane, trichloroethylene, chlorobenzene, o-dichlorobenzene, 1-chloronaphthalene, bromoform, bromobenzene, methyl iodide, iodobenzene and fluorobenzene and hydrocarbon solvents such as benzene, toluene, o-xylene, m-xylene, p-xylene, ethylbenzene, cumene, n-pentane, n-hexane, n-octane, cyclohexane, methylcyclohexane, 1,5-hexadiene and cyclohexadiene. These may be used solely or in the form of a mixture containing two or more solvents. As a solvent, supercritical solvent such as supercritical carbon dioxide may be used.

As dye (c) a dye of formula (I) may be adsorbed on the electrode layer (b) solely or in combination with one or more further dyes. The dyes adsorbed together are not limited to dyes of formula (I). Two or more dyes may be adsorbed on the electrode layer (b) one by one or all together by dissolving the dyes in a solvent. It is preferable to use the dyes with different absorption peaks in different wavelengths to absorb wide range of light wavelengths and generate higher current. The ratio of two or more dyes adsorbed on the electrode layer (b) is not limited but preferably each dye has molar ratio of more than 10%.

For adsorption of the dye (c), an additive may be used in combination. The additive may be any one of an agent that has a function presumably for controlling dye adsorption. The additive includes a condensation agent such as thiol or a hydroxyl compound and a co-adsorbent. These may be used solely or a mixture of them. The molar ratio of the additive to the dye is preferably 0.01 to 1,000, more preferably 0.1 to 100.

For instance, the dye-adsorbed electrode layer may be treated with amines such as 4-tert-butyl pyridine. As a treatment method, immersing the dye-sensitized electrode layer into amine solution which may be diluted with a solvent such as acetnitrile or ethanol can be employed.

In the above manner, the electrode layer of the present invention can be obtained. When the electrolyte layer (e) is in the form of solution or quasi-solid, the electrolyte layer (e) usually contains,
(e-1) electrolyte compound,
(e-2) solvent and/or ionic liquid, and
preferably (e-3) other additives.

Examples of the electrolyte compound (e-1) include a combination of a metal iodide such as lithium iodide, sodium iodide, potassium iodide, cesium iodide or calcium iodide with iodine, a combination of a quaternary ammonium iodide such as tetraalkylammonium iodide, pyridium iodide or imidazolium iodide with iodine, a combination of a metal bromide such as lithium bromide, sodium bromide, potassium bromide, cesium bromide or calcium bromide with bromine, a combination of a quaternary ammonium bromide such as tetraalkylammonium bromide or pyridinium bromide with bromine, metal complexes such as ferrocyanic acid salt-ferricyanic acid salt or ferrocene-ferricynium ion, sulfur compounds such as sodium polysulfide and alkylthiolalkyldisulfide, a viologen dye, hydroquinone-quinone, a combination of a nitroxide radical such as 2,2,6,6-tetramethyl-1-piperidinyloxy (TEMPO) and oxoammonium salt and a combination of a verdazyl radical and a corresponding onium salt.

The above electrolyte compounds (e-1) may be used solely or in the form of a mixture. As an electrolyte compound (e-1), there may be used a molten salt that is in a molten state at room temperature. When such a molten salt is used, particularly, it is not necessary to use a solvent.

The electrolyte compound (e-1) concentration in the electrolyte solution is preferably 0.05 to 20M, more preferably 0.1 to 15M.

For instance, the solvent (e-2) is nitrile solvents such as acetonitrile, methoxy acetonitrile, methoxy propionitrile, propionitrile and benzonitrile, carbonate solvents such as ethylene carbonate, propylene carbonate and diethyl carbonate, alcohol solvents such as methanol, ethanol, isopropyl alcohol, t-butyl alcohol, ethylene glycol and propylene glycol, ether solvents such as dioxane, diethyl ether, dimethoxyethane, tetrahydrofuran, dioxolane, t-butyl methyl ether, ethylene glycol dialkyl ether, propylene glycol monomethyl ether acetate and propylene glycol methyl ether, water, ketone solvents such as acetone, amide solvents such as N,N-dimethylformamide, N,N-dimethylacetamide and N-methylpyrrolidone, heterocyclic compounds such as 3-methyl-2-oxazolidinone, dimethyl sulfoxide, sulfolane and γ-butyrolactone, halogenated hydrocarbon solvents such as dichloromethane, chloroform, dichloroethane, trichloroethane, trichloroethylene, chlorobenzene, o-dichlorobenzene, 1-chloronaphthalene, bromoform, bromobenzene, methyl iodide, iodobenzene and fluorobenzene and hydrocarbon solvents such as benzene, toluene, o-xylene, m-xylene, p-xylene, ethylbenzene, cumene, n-pentane, n-hexane, n-octane, cyclohexane, methylcyclohexane, 1,5-hexadiene and cyclohexadiene or combinations of the above mentioned solvents and the ionic liquid is a quaternary imidazolium salt, a quaternary pyridinium salt, a quaternary ammonium salt or combinations thereof, preferably the anion of the salt is $BF_4^-$, $PF_6^-$, $F(HF)_2^-$, $F(HF)_3^-$, bis(trifluoromethanesulfonyl)imide $[(CF_3SO_2)_2N^-]$, $N(CN)_2^-$, $C(CN)_3^-$, $B(CN)_4^-$, $SCN^-$, $SeCN^-$, $I^-$, $IO_3^-$ or combinations thereof.

For example, a photoelectric conversion device comprises a solvent (e.g. without an ionic liquid). For instance, a photoelectric conversion device comprises an ionic liquid (e.g. without a solvent).

Examples of further additives (e-3) are lithium salts (especially 0.005 to 2.0M, preferably 0.1 to 0.7M) (e.g. $LiClO_4$, $LiSO_3CF_3$ or $Li(CF_3SO_2)N$); guanidinium thiocyanate (especially 0.005 to 2.0M, preferably 0.01 to 1.0M); pyridines (especially 0.005 to 2.0M, preferably 0.02 to 0.7M) (e.g. pyridine, tert-butylpyridine or polyvinylpyridine); imidazoles (especially 0.005 to 2.0M, preferably 0.01 to 1.0M) (e.g. imidazole, methylimidazole, ethylimidazole or propylimidazole); benzimidazoles (especially 0.005 to 2.0M, preferably 0.01 to 1.0M) (e.g. benzimidazole, methylbenzimidazole, ethylbenzimidazole or propylbenzimidazole); quinolines (especially 0.005 to 2.0M, preferably 0.01 to 1.0M), gelling agents (especially 0.1 to 50 wt. %, preferably 1.0 to 10 wt. % based on the weight of the component e) (e.g. polyvinylidene fluoride, polyvinylidene fluoride-hexafluoropropylene copolymer, polyethylene oxide derivatives, polyacrylonitrile derivatives or amino acid derivatives), nano particles (especially 0.1 to 50 wt. %, preferably 1.0 to 10 wt. % based on the weight of the component e) (e.g. conductive nano particles, in particular single-wall carbon nanotubes, multi-wall carboncarbon nanotubes or combinations thereof, carbon fibers, carbon black, polyaniline-carbon black composite, $TiO_2$, $SiO_2$, $SnO_2$ or clay mineral (e.g. kaolinite, smectite, talc, vermiculite, mica and swelling mica)); and combinations thereof.

In the present invention, an inorganic solid compound such as copper iodide, copper thiocyanide or the like, an organic hole-transporting material or an electron-transporting material can be used in place of the electrolyte layer (e).

The instant electrode layer, photoelectric conversion devices and DSC can be prepared as outlined in U.S. Pat. No. 4,927,721, U.S. Pat. No. 5,084,365, U.S. Pat. No. 5,350,644 and U.S. Pat. No. 5,525,440 or in analogy thereto.

The present invention also pertains to a dye sensitized solar cell comprising a photoelectric conversion device as described herein.

The present invention also pertains to the use of a compound of formula (I) as defined herein as a dye in a dye sensitized solar cell.

The present invention further pertains to a compound of formula (I) as defined herein. The compounds of formula (I) can be prepared according to methods known in the art.

Compound of formula (I) can be prepared by condensation of the corresponding pyridinium salt and ketone as described below:

In case of n=1;

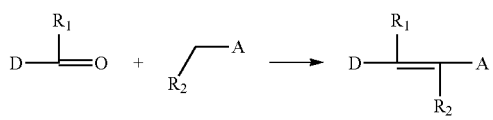

In case of n at least 2;

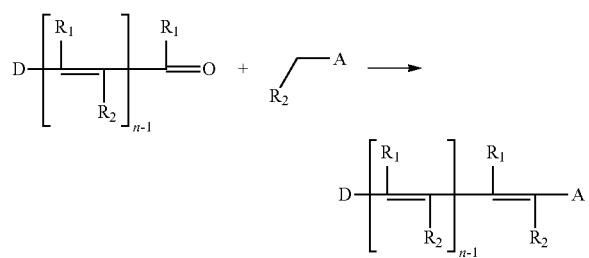

For instance, the reaction conditions of the condensation of the quaternary salts with carbonyl compounds are reflux in ethanol in the presence of piperidine or pyrrolidine (see for instance, J. Chem. Soc. 1961, 5074, Dyes & Pigments 2003, 58, 227), or heating in acetic anhydride (see for instance, Indian J. Chem. 1968, 6, 235), or heating in acetic acid in a presence of ammonium acetate.

Before condensation, the group G may be protected. Then after the condensation reaction, the protection group can be removed. A group G comprising COOH or COO⁻Z⁺ can be protected by, for example, t-butyl group. Then after condensation reactions, the COO-t-butyl group can be converted into COOH or COO⁻Z⁺.

Or compounds of formula (I) can be prepared by condensation of the corresponding pyridine derivatives with carbonyl compounds, followed by quaternization to the corresponding pyridinium.

For instance, the starting material are partly items of commerce or can be obtained according to methods known in the art.

When a denotation (e.g. D, G, $R_1$-$R_2$, $R_{14}$, $R_{14}'$, $R_{25}$-$R_{27}$) occurs more than once (e.g. twice) in a compound, this denotation may be different groups or the same group unless otherwise stated.

It is to be understood that alkyl interrupted by O, S, $NR_{14}$ or combinations comprises at least 2 carbon atoms and in case of combinations comprises at least 3 carbon atoms.

In the definitions the term alkyl comprises within the given limits of carbon atoms, for example methyl, ethyl, propyl, isopropyl, n-butyl, sec-butyl, isobutyl, tert-butyl, 2-ethylbutyl, n-pentyl, isopentyl, 1-methylpentyl, 1,3-dimethylbutyl, n-hexyl, 1-methylhexyl, n-heptyl, 2-methylheptyl, 1,1,3,3-tetramethylbutyl, 1-methylheptyl, 3-methylheptyl, n-octyl, 2-ethylhexyl, 1,1,3-trimethylhexyl, 1,1,3,3-tetramethylpentyl, nonyl, decyl, undecyl, 1-methylundecyl or dodecyl.

Examples of alkenyl are within the given limits of carbon atoms vinyl, allyl, 1-methylethenyl, and the branched and unbranched isomers of butenyl, pentenyl, hex-enyl, heptenyl, octenyl, nonenyl, decenyl, undecenyl and dodecenyl. The term alkenyl also comprises residues with more than one double bond that may be conjugated or non-conjugated, for example may comprise one double bond.

Examples of alkynyl are within the given limits of carbon atoms ethynyl, propargyl, 1-methylethynyl, and the branched and unbranched isomers of butynyl, pentynyl, hexynyl, heptynyl, octynyl, nonynyl, decynyl, undecynyl and dodecynyl. The term alkynyl also comprises residues with more than one triple bond and residues with a triple bond and a double bond, all of which may be conjugated or non-conjugated. For instance, alkynyl comprises one triple bond.

Aryl is for example phenyl, biphenyl, naphthalinyl, anthracenyl, phenanthrenyl or pyrenyl, in particular phenyl or pyrenyl, especially phenyl.

Aryl can be (further) substituted by . . . is to be understood to include the aryl of aralkyl, aralkenyl and aralkynyl.

Heteroaryl may comprise one or more (e.g. 1-4, in particular 1-3, especially 1-2, such as 1 heteroatom preferably selected from the group consisting of O, S and N, especially S and N, in particular N). Examples of heteroaryl are thiophenyl, phenyl thiophenyl, diphenyl thiophenyl, triphenyl thiophenyl, bithiophenyl, terthiophenyl, tetrathiophenyl, furanyl, bifuranyl, terfuranyl, pyrrolyl, carbazolyl, phenyl carbazolyl, diphenyl carbazolyl, triphenyl carbazolyl, tetraphenyl carbazolyl, indolyl, piperidinyl, 9H-purinyl, pteridinyl, chinolinyl, isochinyl, acridinyl, phenazinyl,

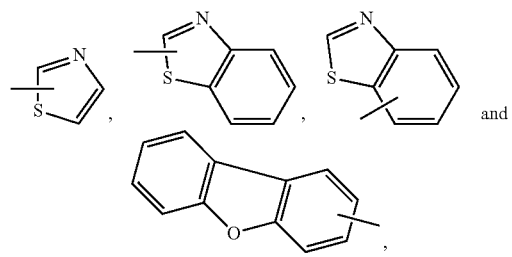

preferred examples are thiophenyl, phenyl thiophenyl, diphenyl thiophenyl, triphenyl thiophenyl, carbazolyl, phenyl carbazolyl, diphenyl carbazolyl, triphenyl carbazolyl, tetraphenyl carbazolyl,

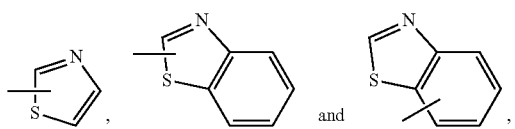

more preferred examples are thiophenyl, triphenyl thiophenyl, carbazolyl, phenyl carbazolyl,

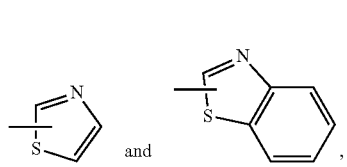

a particularly preferred example is phenyl carbazolyl. Heteroaryl as $R_{18}$ is for instance triphenyl thiophenyl, carbazolyl or phenyl carbazolyl, especially phenyl carbazolyl.

Methyl(fluoren-9-ylidene) is for instance

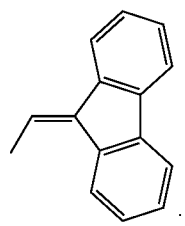

Aralkyl is for instance benzyl or α,α-dimethylbenzyl, especially benzyl.

Aralkenyl includes, for instance,

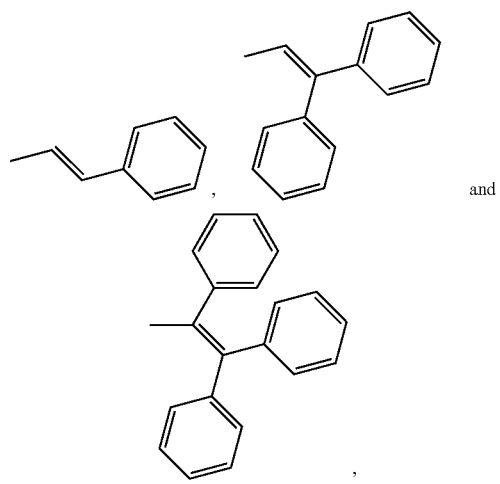

especially

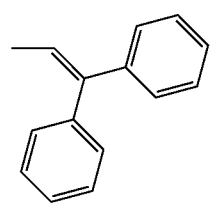

An example of aralkynyl is 2-phenylethynyl.

Some examples of cycloalkyl are

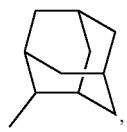

cyclobutyl, cyclopentyl, cyclohexyl, cycloheptyl, cyclooctyl, methylcyclopentyl, dimethylcyclopentyl, methylcyclohexyl and dimethylcyclohexyl, for instance cyclohexyl.

Some examples of cycloalkenyl are cyclopentenyl, cyclohexenyl, methylcyclopentenyl, dimethylcyclopentenyl and methylcyclohexenyl. Cycloalkenyl may comprise more than one double bond that may be conjugated or non-conjugated, for example may comprise one double bond.

Some examples of cycloalkynyl are cyclohexynyl and methylcyclohexenyl.

The term halogen may comprise fluorine, chlorine, bromine and iodine; for example halogen is fluorine.

In the definitions the term alkylene comprises within the given limits of carbon atoms, for example methylene, ethylene, propylene, isopropylene, n-butylene, sec-butylene, isobutylene, tert-butylene, 2-ethylbutylene, n-pentylene, isopentylene, 1-methylpentylene, 1,3-dimethylbutylene, n-hexylene, 1-methylhexylene, n-heptylene, 2-methylheptylene, 1,1,3,3-tetramethylbutylene, 1-methylheptylene, 3-methylheptylene, n-octylene, 2-ethylhexylene, 1,1,3-trimethylhexylene, 1,1,3,3-tetramethylpentylene, nonylene, decylene, undecylene, 1-methylundecylene or dodecylene.

Examples of alkenylene are within the given limits of carbon atoms vinylene, allylene, 1-methylethenylene, and the branched and unbranched isomers of butenylene. The term alkenylene also comprises residues with more than one double bond that may be conjugated or non-conjugated, for example may comprise one double bond.

Arylene is for example phenylene.

The preferences outlined herein apply to all aspects of the invention.

Ratio and % are weight ratio and weight-% unless otherwise stated.

Abbreviations
DSC dye sensitized solar cell

PREPARATION EXAMPLES

Example C-1

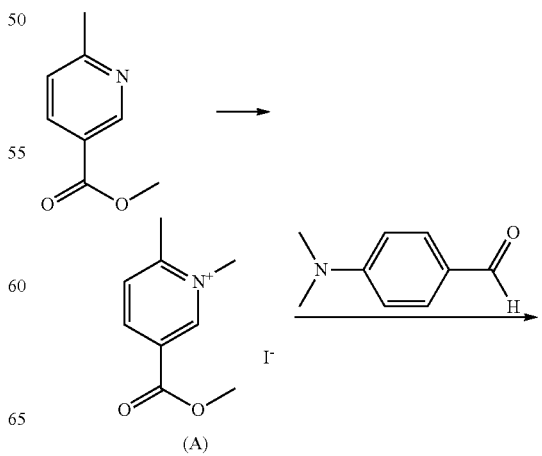

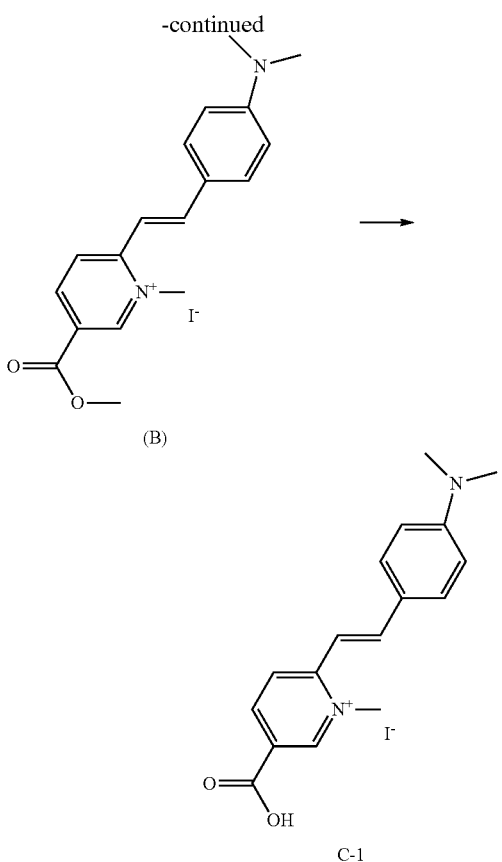

Preparation of (A);

2.5 g (16.5 mmol) of methyl-6-methylnicotionate and 3.1 ml of methyliodide are dissolved in 15 ml of acetone and the solution is stirred reflux for 15 hours. After cooling down to the room temperature, the pale yellow precipitate is washed with acetone and dried under reduced pressure. 3.5 g of pale yellow solid (A) is obtained (yield 72%).

Preparation of (B);

890 mg (0.30 mmol) of (A), 500 mg (0.34 mmol) of 4-dimethylaminobenzaldehyde, 26 mg (0.03 mmol) of piperidine and 18.2 mg (0.03 mmol) of acetic acid are dissolved in 10 ml of toluene and the solution is stirred at 110° C. for 15 hours. After cooling down to the room temperature, the reaction mixture is concentrated under reduced pressure. The crude product is purified by column chromatography and 1.1 g of (B) is obtained (85%).

Preparation of C-1;

The mixture of 100 mg of pyridinium salt (B) and 3 ml of hydrobromic acid (48% in H₂O) are stirred at 60° C. for 18 hours. After cooling down to the room temperature, the reaction mixture is concentrated under reduced pressure. The crude product is purified by column chromatography and 59 mg of C-1 is obtained (61%).

Examples C-2 and C-3

Dyes C-2 and C-3 are prepared in analogy to the above-mentioned synthetic processes.

| No. | Chemical Structure | | | Absorption spectrum | |
| --- | --- | --- | --- | --- | --- |
| | Donor | Spacer | Acceptor | λmax (nm) | ε |
| C-1 | | | | 465.0 | 35700 |
| C-2 | | | | 501.0 | 38000 |

-continued

| No. | Chemical Structure Donor | Spacer | Acceptor | Absorption spectrum λmax (nm) | ε |
|---|---|---|---|---|---|
| C-3 | (carbazole-indoline donor with N-phenyl) | *–CH=CH–* | N-methyl pyridinium iodide with COOH | 503.0 | 34500 |

Examples C-4 and C-14

Dyes C-4 to C-14 are prepared in analogy to synthetic processes of C-1

| No. | Chemical Structure Donor | Spacer | Acceptor | Absorption spectrum λmax (nm) | ε |
|---|---|---|---|---|---|
| C-4 | (methylamino-phenyl with O-pentyl donor) | *–CH=CH–* | N-methyl pyridinium iodide with COOH | 469 | 25500 |
| C-5 | (carbazole-indoline donor with N-phenyl) | *–CH=CH–* | N-hexyl pyridinium iodide with COOH | 507 | 45000 |
| C-6 | (carbazole-indoline donor with N-phenyl) | *–CH=CH–* | N-(biphenylmethyl) pyridinium iodide with COOH | 518 | 14500 |

-continued
| No. | Chemical Structure | | | Absorption spectrum | |
|---|---|---|---|---|---|
| | Donor | Spacer | Acceptor | λmax (nm) | ε |
| C-7 | 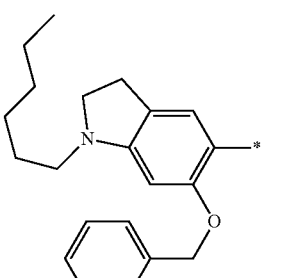 | 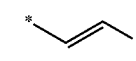 | 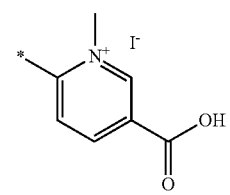 | 511 | 49900 |
| C-8 | 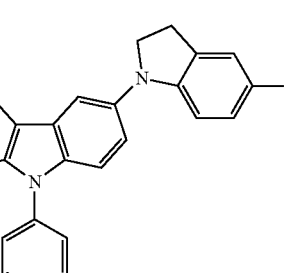 | 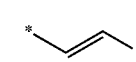 | 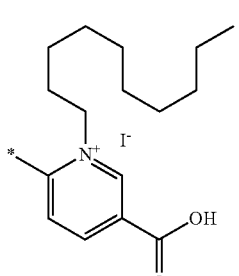 | 504 | 38400 |
| C-9 | 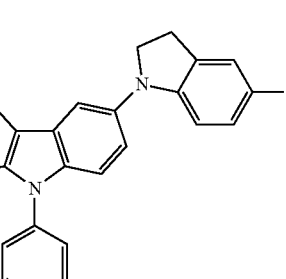 | 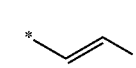 | 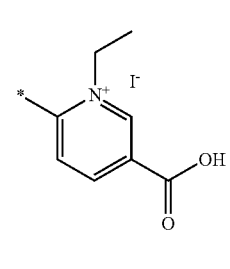 [SMILES: *c1ccc(C(=O)O)c[n+]1CC ; [I-]] | 502 | 40700 |
| C-10 | 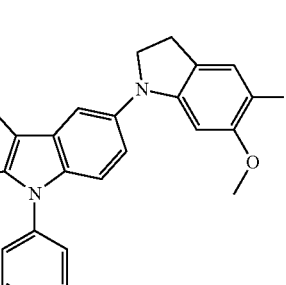 |  | 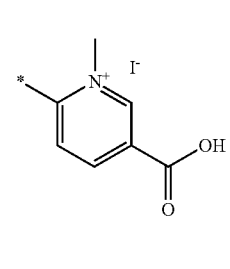 [SMILES: *c1ccc(C(=O)O)c[n+]1C ; [I-]] | 513 | 55000 |
| C-11 | 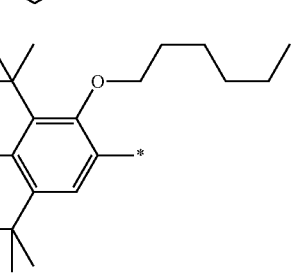 |  | 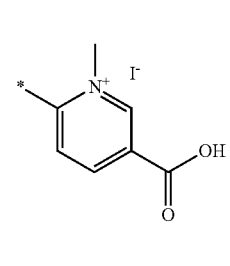 [SMILES: *c1ccc(C(=O)O)c[n+]1C ; [I-]] | 512 | 43600 |

-continued

| No. | Chemical Structure | | | Absorption spectrum | |
|---|---|---|---|---|---|
| | Donor | Spacer | Acceptor | λmax (nm) | ε |
| C-12 | 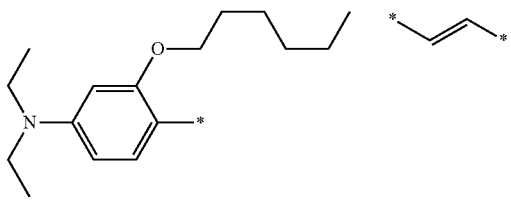 |  | 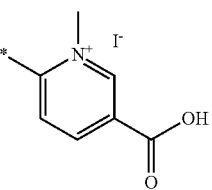 [SMILES: *c1ccc(C(=O)O)c[n+]1C ; [I-]] | 494 | 51800 |
| C-13 | 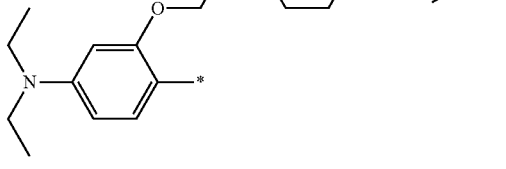 |  | 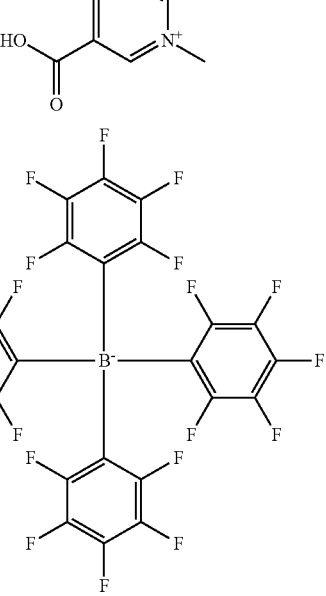 | 486 | 30100 |
| C-14 | 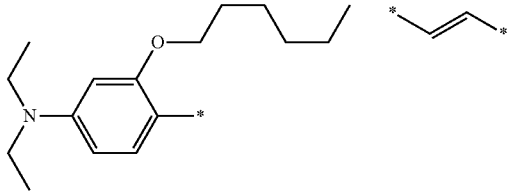 |  | 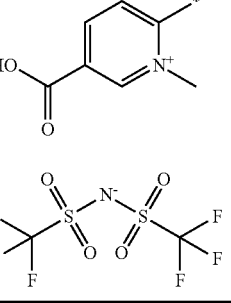 | 486 | 38900 |

Application of Examples

Example A-1

Preparation of DSC Device

Titanium oxide paste (PST-18NR, supplied by JGC Catalysts and Chemicals Ltd.) is applied onto an FTO (tin oxide doped with fluorine) glass substrate (<12 ohms/sq, A11U80, supplied by AGC Fabritech Co., Ltd.) by screen printing method to form a coating having an area size of 0.64 cm². After being dried for 5 minutes at 120° C., a working electrode layer having a thickness of 5 µm is obtained by applying heat treatment in air at 450° C. for 30 minutes and 500° C. for 30 minutes.

0.02 g of a dye (C-1) is dissolved in 25 ml of a mixture solution of acetonitrile+t-butyl alcohol (1:1). The above-prepared transparent working electrode is immersed in the solution at room temperature for 2 hours so as to adsorb the dye.

As a counter electrode, an ITO (indium-tin oxide) glass electrode substrate is prepared having a thickness of 8 nm electrode layer made of platinum formed thereon by sputtering.

A solution of 0.05 M of iodine, 0.1M of lithium iodide and 0.6 M of 1-propyl-2,3-dimethylimidazolium iodide in methoxypropionitrile is used as an electrolytic solution. A photoelectric conversion device is fabricated by making the above working electrode and counter electrode opposed to each other and holding the above electrolyte solution between them with a spacer having 50 μm thickness.

The above photoelectric conversion device is evaluated under the illumination of an artificial sunlight (AM 1.5, 100 mW/cm² intensity) generated by a solar simulator (Peccell Technologies, Inc) from the working electrode side.

Examples A-2 to A-3

DSC device is prepared and evaluated in the same manner as described in the example A-1 except that the compound (C-1) is replaced with a compound (C-2)-(C-3).

Comparative Example A-4 to A-5

DSC device is prepared and evaluated in the same manner as described in the example A-1 except that the compound (C-1) is replaced with a compound (R-1)-(R-2) shown below. Table 1 shows the results.

TABLE 1

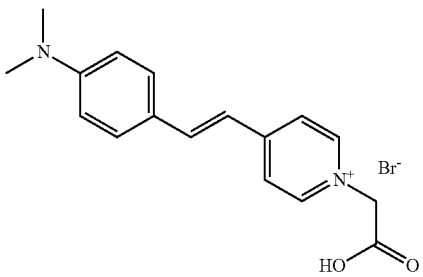 [SMILES: CN(C)c1ccc(/C=C/c2cc[n+](CC(=O)O)cc2)cc1 ; [Br-]]

| Example | Compound | Short-circuit current density (mA/cm²) | Open-circuit voltage (V) | Fill factor (%) | Photo-electric power conversion efficiency (%) |
|---|---|---|---|---|---|
| A-1 | C-1 | 9.5 | 0.63 | 0.49 | 2.94 |
| A-2 | C-2 | 11.9 | 0.62 | 0.50 | 3.75 |
| A-3 | C-3 | 11.3 | 0.60 | 0.50 | 3.40 |
| A-4* | R-1 | 9.8 | 0.50 | 0.52 | 2.54 |
| A-5* | R-2 | 9.3 | 0.55 | 0.53 | 2.72 |

*comparison

As demonstrated in the examples, the dye of the present invention provide DSC device with excellent photovoltaic performance.

Example B-1-B-4

Example of Applying Co-Adsorbent

DSC device is prepared and evaluated in the same manner as described in the example A-1 to A-4 except that additionally 8 mM of steroid compound (D-1) shown below is added to the dye solution.

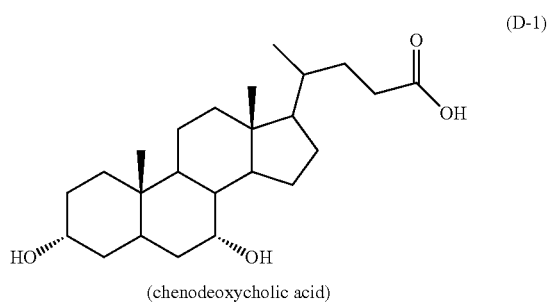 [SMILES: CC(CCC(=O)O)C1CCC2C3C(CC[C@]12C)[C@@]1(C)CC[C@@H](O)CC1C[C@H]3O]

(chenodeoxycholic acid)

Table 2 shows the results.

TABLE 2

| Example | Compound | Short-circuit current density (mA/cm²) | Open-circuit voltage (V) | Fill factor (%) | Photo-electric power conversion efficiency (%) |
|---|---|---|---|---|---|
| B-1 | C-1 | 11.0 | 0.63 | 0.49 | 3.38 |
| B-2 | C-2 | 13.3 | 0.64 | 0.51 | 4.39 |
| B-3 | C-3 | 12.9 | 0.62 | 0.41 | 3.26 |
| B-4 | R-1 | 9.7 | 0.58 | 0.53 | 2.96 |

Examples A-6 to A-16

DSC device is prepared and evaluated in the same manner as described in the example A-1 except that the compound (C-1) is replaced with a compound (C-4)-(C-14).

TABLE 4

| Example | Compound | Short-circuit current density (mA/cm²) | Open-circuit voltage (V) | Fill factor (%) | Photo-electric power conversion efficiency (%) |
|---|---|---|---|---|---|
| A-6 | C-4 | 9.03 | 0.648 | 0.63 | 3.69 |
| A-7 | C-5 | 10.73 | 0.614 | 0.54 | 3.54 |
| A-8 | C-6 | 11.64 | 0.556 | 0.49 | 3.19 |
| A-9 | C-7 | 11.34 | 0.603 | 0.52 | 3.54 |
| A-10 | C-8 | 13.23 | 0.566 | 0.53 | 3.94 |
| A-11 | C-9 | 14.63 | 0.521 | 0.48 | 3.63 |
| A-12 | C-10 | 13.37 | 0.545 | 0.51 | 3.69 |
| A-13 | C-11 | 11.48 | 0.511 | 0.52 | 3.07 |
| A-14 | C-12 | 12.07 | 0.545 | 0.51 | 3.35 |
| A-15 | C-13 | 10.23 | 0.584 | 0.55 | 3.29 |
| A-16 | C-14 | 10.46 | 0.554 | 0.55 | 3.18 |

As demonstrated in the examples, combinations of the dye according to the present invention with the steroid compound provide DSC device with excellent photovoltaic performance.

Example B-5

Example of Changing Dye Adsorption Time

DSC device is prepared and evaluated in the same manner as described in the example B-3 except that transparent working electrode is immersed in the dye solution at room temperature for 4 hours. Table 3 shows the results.

TABLE 3

| Example | Compound | Short-circuit current density (mA/cm$^2$) | Open-circuit voltage (V) | Fill factor (%) | Photo-electric power conversion efficiency (%) |
|---|---|---|---|---|---|
| B-5 | C-3 | 14.1 | 0.62 | 0.49 | 4.29 |

What is claimed is:

1. An electrode layer, comprising:
a porous film comprising oxide semiconductor fine particles sensitized with a dye of formula (I):

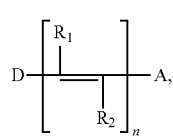
(I)

wherein
n is 1-6,
$R_1$ and $R_2$ are each independently H, a $C_1$-$C_{20}$ alkyl optionally interrupted with at least one selected from the group consisting of O, S, and $NR_{14}$, a $C_6$-$C_{20}$ aryl, a $C_4$-$C_{20}$ heteroaryl, or a $C_6$-$C_{20}$ aryl substituted with 1-3 $C_1$-$C_8$ alkyl groups, and additionally $R_1$ is optionally D,
A is a group of formula (II) or (III):

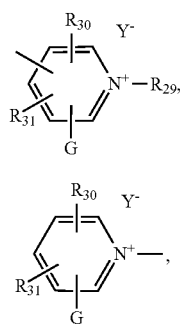
(II)

(III)

wherein
$Y^-$ is an inorganic anion or an organic anion,
$R_{29}$ is a $C_1$-$C_{20}$ alkyl optionally interrupted with at least one selected from the group consisting of O, S, and $NR_{14}$, a $C_6$-$C_{20}$ aryl, a $C_4$-$C_{20}$ heteroaryl, $O^-$, $OR_{32}$, a $C_7$-$C_{20}$ aralkyl, a $C_6$-$C_{20}$ aryl substituted with 1-3 $C_1$-$C_8$ alkyl groups, or a $C_7$-$C_{20}$ aralkyl substituted at the aryl with a 1-3 $C_1$-$C_8$ alkyl groups,
$R_{30}$ is G, H, $OR_{32}$, a $C_1$-$C_{20}$ alkyl optionally interrupted with at least one selected from the group consisting of O, S, and $NR_{14}$, a $C_6$-$C_{20}$ aryl, a $C_4$-$C_{20}$ heteroaryl, or a $C_6$-$C_{20}$ aryl substituted with 1-3 $C_1$-$C_8$ alkyl groups,
$R_{31}$ is H or

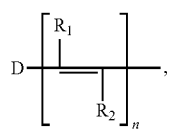
, $R_{32}$ is a $C_1$-$C_{20}$ alkyl optionally interrupted with at least one selected from the group consisting of O, S, and $NR_{14}$, a $C_6$-$C_{20}$ aryl, a $C_4$-$C_{20}$ heteroaryl, or a $C_6$-$C_{20}$ aryl substituted with 1-3 $C_1$-$C_8$ alkyl groups,
G is —$R_{28}$—COOH, —$R_{28}$—COO$^-$Z$^+$; —$R_{28}$—SO$_3$H, —$R_{28}$—SO$_3^-$Z$^+$; —$R_{28}$—OP(O)(O$^-$Z$^+$)$_2$, —$R_{28}$—OP(O)(OH)$_2$, or —$R_{28}$—OP(O)(OH)O$^-$Z$^+$,
wherein
$R_{28}$ is a direct bond, a $C_1$-$C_{20}$ alkylene, a $C_2$-$C_4$ alkenylene, or a $C_6$-$C_{10}$ arylene,
$Z^+$ is an organic or inorganic cation,
each D is independently a group of formula (III) or (IV),

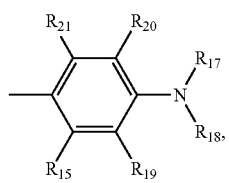
(III)

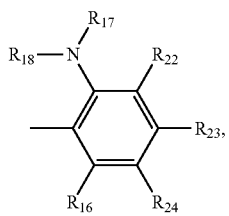
(IV)

wherein
$R_{17}$ and $R_{18}$ are each independently an optionally substituted moiety selected from the group consisting of a $C_1$-$C_{20}$ alkyl, a $C_2$-$C_{20}$ alkenyl, a $C_2$-$C_{20}$ alkynyl, a $C_6$-$C_{20}$ aryl, a $C_4$-$C_{24}$ heteroaryl, a $C_7$-$C_{20}$ aralkyl, a $C_8$-$C_{20}$ aralkenyl, a $C_8$-$C_{20}$ aralkynyl, a $C_4$-$C_{20}$ cycloalkyl, a $C_5$-$C_{20}$ cycloalkenyl, and a $C_6$-$C_{20}$ cycloalkynyl, wherein the alkyl and cycloalkyl are optionally interrupted with at least one selected from the group consisting of O, S, and $NR_{14}$, or
at least one selected from the group consisting of (i) $R_{17}$ and $R_{18}$, (ii) $R_{17}$ and $R_{22}$, (iii) $R_{17}$ and $R_{20}$, and (iv) $R_{18}$ and $R_{19}$ form together an optionally substituted 5-, 6-, or 7-membered ring,
$R_{15}$, $R_{16}$, $R_{19}$, $R_{20}$, $R_{21}$, $R_{22}$, $R_{23}$, and $R_{24}$ are each independently H, $NR_{25}R_{26}$, $OR_{25}$, $SR_{25}$, $NR_{25}$—$NR_{26}R_{27}$, $NR_{25}$—$OR_{26}$, O—CO—$R_{25}$, O—CO—$OR_{25}$, O—CO—$NR_{25}R_{26}$, $NR_{25}$—CO—$R_{26}$, $NR_{25}$—CO—$OR_{26}$, $NR_{25}$—CO—$NR_{26}R_{27}$, CO—$R_{25}$, CO—$OR_{25}$, CO—$NR_{25}R_{26}$, S—CO—$R_{25}$, CO—$SR_{25}$, CO—$NR_{25}$—$NR_{26}R_{27}$, CO—$NR_{25}$—$OR_{26}$, CO—O—CO—$R_{25}$, CO—O—O—CO—$OR_{25}$, CO—O—CO—$NR_{25}R_{26}$, CO—$NR_{25}$—CO—$R_{26}$, CO—$NR_{25}$—CO—$OR_{26}$, or an optionally substitute moiety selected from the group consisting of a $C_1$-$C_{20}$ alkyl, a $C_6$-$C_{20}$ aryl, a $C_2$-$C_{20}$ alkenyl, a $C_2$-$C_{20}$ alkynyl, a $C_6$-$C_{20}$ aryl, a $C_4$-$C_{20}$ heteroaryl, a $C_7$-$C_{20}$ aralkyl, a $C_8$-$C_{20}$ aralkenyl, a $C_8$-$C_{20}$ aralkynyl, a $C_4$-$C_{20}$ cycloalkyl, a $C_8$-$C_{20}$ cycloalkenyl, and a $C_6$-$C_{20}$ cycloalkynyl, wherein the alkyl and cycloalkyl are optionally interrupted with at least one selected from the group consisting of O, S, and $NR_{14}$,
$R_{25}$, $R_{26}$, and $R_{27}$ are each independently H or an optionally substituted moiety selected from the group consisting of a $C_1$-$C_{20}$ alkyl, a $C_6$-$C_{20}$ aryl, a $C_2$-$C_{20}$ alkenyl, a $C_2$-$C_{20}$ alkynyl, a $C_6$-$C_{20}$ aryl, a $C_4$-$C_{20}$ heteroaryl, a $C_7$-$C_{20}$ aralkyl, a $C_8$-$C_{20}$ aralkenyl, a $C_8$-$C_{20}$ aralkynyl, a $C_4$-$C_{20}$ cycloalkyl, a $C_5$-$C_{20}$ cycloalkenyl, and a $C_6$-$C_{20}$ cycloalkynyl, wherein the alkyl and cycloalkyl are optionally interrupted with at least one selected from the group consisting of O, S, and $NR_{14}$, and $R_{14}$ is H or a $C_1$-$C_{20}$ alkyl.

2. The electrode layer of claim 1, wherein, in formula (I), n is 1 or 2,

A is a group of formula (II) or (III), wherein $Y^-$ is $Cl^-$, $Br^-$, $I^-$, $SCN^-$, $BF_4^-$, $PF_6^-$, $ClO_4^-$, $SbF_6^-$, $AsF_6^-$, $SO_3^-$, an organic anion selected from the group consisting of a $C_1$-$C_{20}$ alkyl-$COO^-$, a $C_6$-$C_{20}$ aryl-$COO^-$, a $C_1$-$C_{20}$ alkyl-$S(=O)_2O^-$, a $C_6$-$C_{20}$ aryl-$S(=O)_2O^-$, a $C_1$-$C_{20}$ alkyl-$O$—$S(=O)_2O^-$, a $C_6$-$C_{20}$ aryl-$O$—$S(=O)_2O^-$, a $C_1$-$C_{20}$ alkyl-$P(=O)_2O^-$, a $C_6$-$C_{20}$ aryl-$P(=O)_2O^-$, a $C_1$-$C_{20}$ alkyl-$O$—$P(=O)_2O^-$, and a $C_6$-$C_{20}$ aryl-$O$—$P(=O)_2O^-$, wherein the aryl is optionally substituted with 1 to 4 $C_1$-$C_{20}$ alkyl groups, or an anionic group of the dye selected from the group consisting of $COO^-$, $SO_3^-$, $P(=O)(O^-)(O^-Z^+)$, and $P(=O)(OH)(O^-)$, $Z^+$ is $N(R_{14})_4^+$, $Li^+$, $Na^+$, $K^+$, or the cationic group

in group A of formula (I),

D is independently a group of formula (III) or (IV):

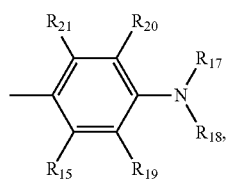

(III)

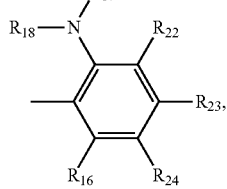

(IV)

wherein $R_{17}$ and $R_{18}$ are each independently fluorenyl, a $C_1$-$C_{20}$ alkyl, a $C_2$-$C_{20}$ alkenyl, a $C_2$-$C_{20}$ alkynyl, a $C_6$-$C_{20}$ aryl, a $C_4$-$C_{24}$ heteroaryl, a $C_7$-$C_{20}$ aralkyl, a $C_8$-$C_{20}$ aralkenyl, a $C_8$-$C_{20}$ aralkynyl, a $C_4$-$C_{20}$ cycloalkyl, a $C_5$-$C_{20}$ cycloalkenyl, or a $C_6$-$C_{20}$ cycloalkynyl, wherein the fluorenyl, alkyl, and cycloalkyl are optionally interrupted with at least one selected from the group consisting of O, S, and $NR_{14}$, the alkyl, alkenyl, alkynyl, aryl, heteroaryl, aralkyl, aralkenyl, aralkynyl, cycloalkyl, cycloalkenyl, and cycloalkynyl are optionally substituted with at least one selected from the group consisting of tetrahydrofuranyl, a halogen, S—$R_{14}$, O—$R_{14}$, CO—$OR_{14}$, O—CO—$R_{14}$, $NR_{14}R_{14}'$, $CONR_{14}R_{14}'$, $NR_{14}$—CO—$R_{14}'$, $S(=O)_2OR_{14}$, and $S(=O)_2O^-Z^+$, and the fluorenyl, aryl, and heteroaryl are optionally substituted further with at least one selected from the group consisting of maleic anhydridyl, maleimidyl, indenyl, a $C_1$-$C_{20}$ alkyl, a $C_2$-$C_{20}$ alkenyl, a $C_2$-$C_{20}$ alkynyl, a $C_7$-$C_{20}$ aralkyl, a $C_8$-$C_{20}$ aralkenyl, a $C_8$-$C_{20}$ aralkynyl, a $C_4$-$C_{20}$ cycloalkyl, a $C_5$-$C_{20}$ cycloalkenyl, and a $C_6$-$C_{20}$ cycloalkynyl, wherein the maleic anhydridyl and maleimidyl are optionally substituted with at least one selected from the group consisting of a $C_1$-$C_{20}$ alkyl, a $C_6$-$C_{20}$ aryl, and a phenyl-$NR_{14}R_{14}'$, or $R_{17}$ and $R_{18}$ form, together with the N they are attached to, a piperidinyl, a piperazinyl, a morpholinyl, a imidazolidinyl, or a pyrrollidinyl, each being optionally substituted with at least one selected from the group consisting of a $C_1$-$C_{20}$ alkyl, a $C_1$-$C_{20}$ alkylidene, benzo, trimethylene, tetramethylene, all of which are optionally substituted with at least one selected from the group consisting of a halogen, S—$R_{14}$, O—$R_{14}$, CO—$OR_{14}$, O—CO—$R_{14}$, $NR_{14}R_{14}'$, $CONR_{14}R_{14}'$, $NR_{14}$—CO—$R_{14}'$, $S(=O)_2OR_{14}$, $S(=O)_2O^-Z^+$, or at least one selected from the group consisting of (i) $R_{17}$ and $R_{22}$, (ii) $R_{17}$ and $R_{20}$ and (iii) $R_{18}$ and $R_{19}$ form, together with the N-atom $R_{17}$ and $R_{18}$ are attached to, a moiety selected from the group consisting of:

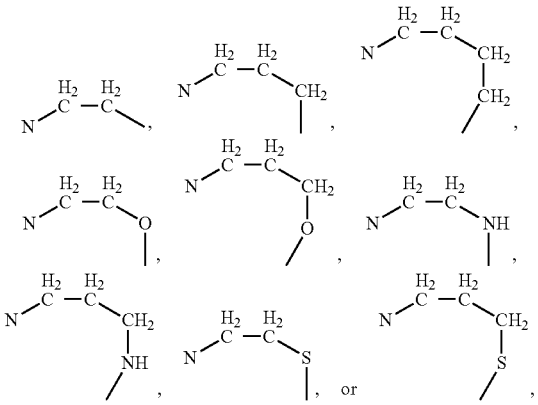

wherein each moiety optionally has at least one selected from the group consisting of (i) one or more H-atoms independently replaced with a $C_1$-$C_{20}$ alkyl, a $C_1$-$C_{20}$ alkylidene, or a phenyl, (ii) two geminal H-atoms replaced with a $C_1$-$C_{20}$ alkylidene, and (iii) two vicinal H-atoms replaced with a benzo optionally substituted with methyl (fluoren-9-ylidene), trimethylene, or tetramethylene, $R_{15}$, $R_{16}$, $R_{19}$, $R_{20}$, $R_{21}$, $R_{22}$, $R_{23}$ and $R_{24}$ are each independently H, $NR_{25}R_{26}$, $OR_{25}$, $SR_{25}$, $NR_{25}$—$NR_{26}R_{27}$, $NR_{25}$—$OR_{26}$, O—CO—$R_{25}$, O—CO—$OR_{25}$, O—CO—$NR_{25}R_{26}$, $NR_{25}$—CO—$R_{26}$, $NR_{25}$—CO—$OR_{26}$, $NR_{25}$—CO—$NR_{26}R_{27}$, CO—$R_{25}$, CO—$OR_{25}$, CO—$NR_{25}R_{26}$, CO—$SR_{25}$, CO—$NR_{25}$—$NR_{26}R_{27}$, CO—$NR_{25}$—$OR_{26}$, CO—O—CO—$R_{25}$, CO—O—CO—$OR_{25}$, CO—O—CO—$NR_{25}R_{26}$, $NR_{25}$—CO—$R_{26}$, CO—$NR_{25}$—CO—$OR_{26}$, a $C_1$-$C_{20}$ alkyl, a $C_2$-$C_{20}$ alkenyl, a $C_2$-$C_{20}$ alkynyl, a $C_6$-$C_{20}$ aryl, a $C_4$-$C_{20}$ heteroaryl, a $C_7$-$C_{20}$ aralkyl, a $C_8$-$C_{20}$ aralkenyl, a $C_8$-$C_{20}$ aralkynyl, a $C_4$-$C_{20}$ cycloalkyl, a $C_5$-$C_{20}$ cycloalkenyl, or a $C_6$-$C_{20}$ cycloalkynyl, wherein the alkyl and cycloalkyl are optionally interrupted with at least one selected from the group consisting of O, S, and $NR_{14}$, the alkyl, alkenyl, alkynyl, aryl, heteroaryl, aralkyl, aralkenyl, aralkynyl, cycloalkyl, cycloalkenyl, and cycloalkynyl are optionally substituted with at least one selected from the group consisting of a halogen, $S-R_{14}$, $O-R_{14}$, $CO-OR_{14}$, $O-CO-R_{14}$, $NR_{14}R_{14}'$, $CONR_{14}R_{14}'$, $NR_{14}-CO-R_{14}'$, $S(=O)_2OR_{14}$, and $S(=O)_2O^-Z^+$, and the aryl and heteroaryl are optionally substituted further with at least one selected from the group consisting of a $C_1$-$C_{20}$ alkyl, a $C_2$-$C_{20}$ alkenyl, a $C_2$-$C_{20}$ alkynyl, a $C_7$-$C_{20}$ aralkyl, a $C_8$-$C_{20}$ aralkenyl, a $C_8$-$C_{20}$ aralkynyl, a $C_4$-$C_{20}$ cycloalkyl, a $C_8$-$C_{20}$ cycloalkenyl, and a $C_6$-$C_{20}$ cycloalkynyl, wherein $R_{25}$, $R_{26}$ and $R_{27}$ are each independently H, a $C_1$-$C_{20}$ alkyl, a $C_6$-$C_{20}$ aryl, a $C_2$-$C_{20}$ alkenyl, a $C_2$-$C_{20}$ alkynyl, a $C_6$-$C_{20}$ aryl, a $C_4$-$C_{20}$ heteroaryl, a $C_7$-$C_{20}$ aralkyl, a $C_8$-$C_{20}$ aralkenyl, a $C_8$-$C_{20}$ aralkynyl, a $C_4$-$C_{20}$ cycloalkyl, a $C_5$-$C_{20}$ cycloalkenyl, or a $C_6$-$C_{20}$ cycloalkynyl, wherein (i) the alkyl and cycloalkyl are optionally interrupted with at least one selected from the group consisting of O, S, and $NR_{14}$, (ii) the alkyl, alkenyl, alkynyl, aryl, heteroaryl, aralkyl, aralkenyl, aralkynyl, cycloalkyl, cycloalkenyl, and cycloalkynyl are optionally substituted with at least one selected from the group consisting of pyridinium*$Y^-$, maleic anhydridyl, maleimidyl, a halogen, $S-R_{14}$, $O-R_{14}$, $CO-OR_{14}$, $O-CO-R_{14}$, $NR_{14}R_{14}'$, $CONR_{14}R_{14}'$, $NR_{14}-CO-R_{14}'$, $S(=O)_2OR_{14}$, $S(=O)_2O^-Z^+$, and (iii) the aryl and heteroaryl are optionally substituted further with at least one selected from the group consisting of a $C_1$-$C_{20}$ alkyl, a $C_2$-$C_{20}$ alkenyl, a $C_2$-$C_{20}$ alkynyl, a $C_7$-$C_{20}$ aralkyl, a $C_8$-$C_{20}$ aralkenyl, a $C_8$-$C_{20}$ aralkynyl, a $C_4$-$C_{20}$ cycloalkyl, a $C_5$-$C_{20}$ cycloalkenyl, and a $C_6$-$C_{20}$ cycloalkynyl, wherein the pyridinium, maleic anhydridyl, maleimidyl are optionally substituted with at least one selected from the group consisting of a $C_1$-$C_{20}$ alkyl, a $C_2$-$C_{20}$ alkenyl, a $C_2$-$C_{20}$ alkynyl, a $C_6$-$C_{20}$ aryl, a $C_6$-$C_{20}$ aryl-$O-R_{14}$, a $C_7$-$C_{20}$ aralkyl, a $C_8$-$C_{20}$ aralkenyl, a $C_8$-$C_{20}$ aralkynyl, a $C_4$-$C_{20}$ cycloalkyl, a $C_5$-$C_{20}$ cycloalkenyl, a $C_6$-$C_{20}$ cycloalkynyl, $S-R_{14}$, $O-R_{14}$, $CO-OR_{14}$, $O-CO-R_{14}$, $NR_{14}R_{14}'$, $CONR_{14}R_{14}'$, and $NR_{14}-CO-R_{14}'$, and $R_{14}$ and $R_{14}'$ are each independently H or a $C_1$-$C_{20}$ alkyl.

3. The electrode layer of claim 2, wherein, in formula (I), $R_1$ and $R_2$ are each independently H, a $C_1$-$C_{20}$ alkyl, or a $C_6$-$C_{20}$ aryl, and additionally $R_1$ is optionally D, A is a group of formula (IIa) or (IIb):

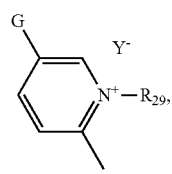
(IIa)

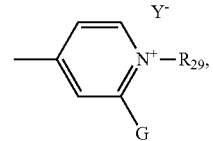
(IIb)

wherein $Y^-$ is $Cl^-$, $Br^-$, $I^-$, $SCN^-$, $BF_4^-$, $PF_6^-$, $ClO_4^-$, $SbF_6^-$, $AsF_6^-$, $SO_3^-$, an organic anion selected from the group consisting of a $C_1$-$C_{20}$ alkyl-$COO^-$, a $C_6$-$C_{20}$ aryl-$COO^-$, a $C_1$-$C_{20}$ alkyl-$S(=O)_2O^-$, a $C_6$-$C_{20}$ aryl-$S(=O)_2O^-$, a $C_1$-$C_{20}$ alkyl-$O-S(=O)_2O^-$, a $C_6$-$C_{20}$ aryl-$O-S(=O)_2O^-$, a $C_1$-$C_{20}$ alkyl-$P(=O)_2O^-$, a $C_6$-$C_{20}$ aryl-$P(=O)_2O^-$, a $C_1$-$C_{20}$ alkyl-$O-P(=O)_2O^-$, and a $C_6$-$C_{20}$ aryl-$O-P(=O)_2O^-$, wherein the aryl is optionally substituted with 1 to 4 $C_1$-$C_{20}$ alkyl groups, or a $COO^-$ anionic group which is part of the dye of formula (I), $R_{29}$ is a $C_1$-$C_{20}$ alkyl, $O^-$, $O-C_1$-$C_{20}$ alkyl, or a $C_7$-$C_{20}$ aralkyl substituted at the aryl with 1 $C_1$-$C_8$ alkyl, G is $-R_{28}-COOH$ or $-R_{28}-COO^-Z^+$, wherein $R_{28}$ is a direct bond, $C_2$-$C_4$ alkenylene, or $C_6$arylene, $Z^+$ is $N(R_{14})_4^+$, $Li^+$, $Na^+$, $K^+$, or the cationic group

of group A in formula (I),

D is a group of formula (III):

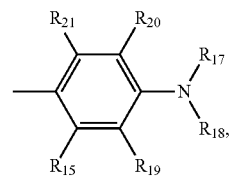
(III)

wherein $R_{17}$ and $R_{18}$ are each independently a $C_1$-$C_8$ alkyl, a $C_2$-$C_8$ alkenyl, a $C_6$-$C_{20}$ aryl, a $C_4$-$C_{24}$ heteroaryl, a $C_7$-$C_{20}$ aralkyl, a $C_8$-$C_{20}$ aralkenyl, a $C_8$-$C_{10}$ aralkynyl, or a $C_5$-$C_{12}$ cycloalkyl, wherein the alkyl, alkenyl, aryl, heteroaryl, aralkyl, aralkenyl, aralkynyl, and cycloalkyl optionally substituted with at least one selected from the group consisting of tetrahydrofuranyl, a halogen, $S-R_{14}$, $O-R_{14}$, $CO-OR_{14}$, $O-CO-R_{14}$, $NR_{14}R_{14}'$, $CONR_{14}R_{14}'$, $NR_{14}-CO-R_{14}'$, and the aryl and heteroaryl optionally substituted further with a $C_1$-$C_8$alkyl, a $C_2$-$C_8$alkenyl, or a $C_8$-$C_{20}$ aralkenyl, or $R_{17}$ and $R_{20}$ form, together with the N-atom $R_{17}$ and $R_{18}$ are attached to, a moiety selected from the group consisting of:

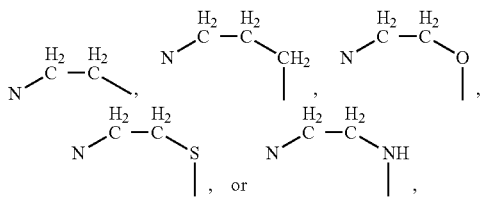

each moiety optionally has at least one selected from the group consisting of (i) one or more H-atoms replaced with at least one selected from the group consisting of a $C_1$-$C_{20}$alkyl and a $C_6$-$C_{20}$ aryl, (ii) two geminal H-atoms replaced with a $C_1$-$C_{20}$ alkylidene, and (iii) two vicinal H-atoms replaced with a benzo optionally substituted with methyl (fluoren-9-ylidene), trimethylene, or tetramethylene, $R_{15}$ is H, $NR_{25}R_{26}$, $OR_{25}$, $SR_{25}$, O—CO—$R_{25}$, or $NR_{25}$—CO—$R_{26}$, $R_{19}$, $R_{20}$, and $R_{21}$ are H, $R_{25}$ and $R_{26}$ are each independently H, a $C_1$-$C_{14}$ alkyl, a $C_6$ aryl, or a $C_7$-$C_{10}$ aralkyl, wherein the alkyl, aryl, and aralkyl are optionally substituted with at least one selected from the group consisting of pyridinium*$Y^-$, a halogen, S—$R_{14}$, O—$R_{14}$, CO—$OR_{14}$, O—CO—$R_{14}$, $NR_{14}R_{14}'$, $CONR_{14}R_{14}'$, $NR_{14}$—CO—$R_{14}'$, wherein the pyridinium and aryl are optionally substituted further with a $C_1$-$C_8$ alkyl.

4. The electrode layer of claim 3, wherein, in formula (I), n is 1, $R_1$ and $R_2$ are H, A is a group of formula (IIa):

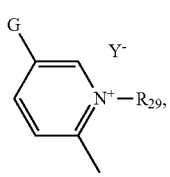

wherein $Y^-$ is $Cl^-$, $Br^-$, or $I^-$, $R_{29}$ is a $C_1$-$C_8$ alkyl,

G is —$R_{28}$—COOH, wherein $R_{28}$ is a direct bond,

D is a group of formula (III);

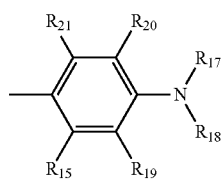

$R_{17}$ is a $C_1$-$C_8$ alkyl, or $R_{17}$ and $R_{20}$ form, together with the N-atom $R_{17}$ and $R_{18}$ are attached to, a moiety selected from the group consisting of

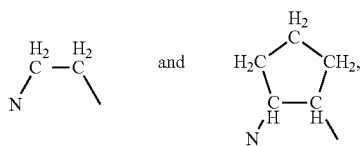

$R_{18}$ is a $C_1$-$C_8$ alkyl, a $C_6$-$C_{24}$ heteroaryl, or a $C_6$-$C_{20}$ aryl substituted with a $C_8$-$C_{20}$ aralkenyl, and $R_{15}$, $R_{19}$, $R_{20}$, and $R_{21}$ are H.

5. The electrode layer of claim 1, wherein, in formula (I), n is 1 or 2, $R_1$ and $R_2$ are each independently H, a $C_1$-$C_{20}$ alkyl, or a $C_6$-$C_{20}$ aryl, and additionally $R_1$ is optionally D, A is a group of formula (IIa) or (IIb):

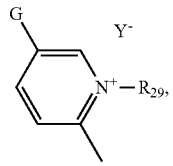

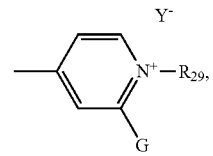

wherein $Y^-$ is

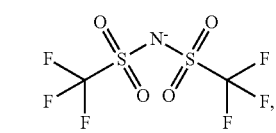

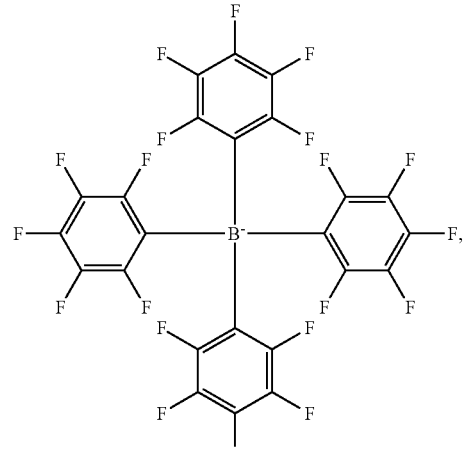

$Cl^-$, $Br^-$, $I^-$, $SCN^-$, $BF_4^-$, $PF_6^-$, $ClO_4^-$, $SbF_6^-$, $AsF_6^-$, $SO_3^-$, an organic anion selected from the group consisting of a $C_1$-$C_{20}$ alkyl-$COO^-$, a $C_6$-$C_{20}$ aryl-$COO^-$, a $C_1$-$C_{20}$ alkyl-S($=$O)$_2$O$^-$, a $C_6$-$C_{20}$ aryl-S($=$O)$_2$O$^-$, a $C_1$-$C_{20}$ alkyl-O—S($=$O)$_2$O$^-$, a $C_6$-$C_{20}$ aryl-O—S($=$O)$_2$O$^-$, a $C_1$-$C_{20}$ alkyl-P($=$O)$_2$O$^-$, a $C_6$-$C_{20}$ aryl-P($=$O)$_2$O$^-$, a $C_1$-$C_{20}$ alkyl-O—P($=$O)$_2$O$^-$, and a $C_6$-$C_{20}$ aryl-O—P($=$O)$_2$O$^-$, wherein the aryl is optionally substituted with 1 to 4 $C_1$-$C_{20}$ alkyl groups, or a COO⁻ anionic group, which is part of the dye of formula (I), $R_{29}$ is a $C_1$-$C_{20}$ alkyl, O⁻, an O—$C_1$-$C_{20}$ alkyl, or a $C_7$-$C_{20}$ aralkyl optionally substituted at the aryl with 1 $C_1$-$C_8$ alkyl, G is —$R_{28}$—COOH or —$R_{28}$—COO⁻Z⁺, wherein
$R_{28}$ is a direct bond, a $C_2$-$C_4$ alkenylene, or a $C_6$ arylene, Z⁺ is N($R_{14}$)$_4$⁺, Li⁺, Na⁺, K⁺, or the cationic group

in group A of formula (I),

D is a group of formula (III):

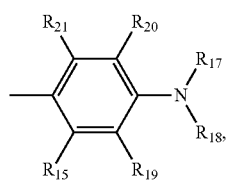

(III)

wherein
$R_{17}$ and $R_{18}$ are each independently a $C_1$-$C_8$ alkyl, a $C_2$-$C_8$ alkenyl, a $C_6$-$C_{20}$ aryl, a $C_4$-$C_{24}$ heteroaryl, a $C_7$-$C_{20}$ aralkyl, a $C_8$-$C_{20}$ aralkenyl, a $C_8$-$C_{10}$ aralkynyl, or a $C_5$-$C_{12}$ cycloalkyl, wherein the alkyl, alkenyl, aryl, heteroaryl, aralkyl, aralkenyl, aralkynyl, and cycloalkyl are optionally substituted with at least one selected from the group consisting of tetrahydrofuranyl, a halogen, S—$R_{14}$, O—$R_{14}$, CO—O$R_{14}$, O—CO—$R_{14}$, N$R_{14}R_{14}'$, CON$R_{14}R_{14}'$, N$R_{14}$—CO—$R_{14}'$, and the aryl and heteroaryl are optionally substituted further with a $C_1$-$C_8$ alkyl, a $C_2$-$C_8$ alkenyl, or a $C_8$-$C_{20}$ aralkenyl, or at least one selected from the group consisting of (i) $R_{17}$ and $R_{20}$ and (ii) $R_{18}$ and $R_{19}$ form, together with the N-atom $R_{17}$ and $R_{18}$ are attached to, a moiety selected from the group consisting of:

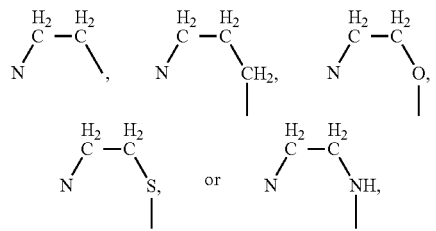

wherein each moiety optionally has at least one selected from the group consisting of (i) one or more H-atoms replaced with at least one selected from the group consisting of a $C_1$-$C_{20}$ alkyl and a $C_6$-$C_{20}$ aryl, (ii) two geminal H-atoms replaced with a $C_1$-$C_{20}$alkylidene, and (iii) two vicinal H-atoms replaced with a benzo optionally substituted with methyl (fluoren-9-ylidene), a trimethylene, or a tetramethylene, $R_{15}$ is H, N$R_{25}R_{26}$, O$R_{25}$, S$R_{25}$, O—CO—$R_{25}$, or N$R_{25}$—CO—$R_{26}$, $R_{19}$, $R_{20}$, and $R_{21}$ are H, $R_{25}$ and $R_{26}$ are each independently H, a $C_1$-$C_{14}$ alkyl, a $C_6$ aryl, or a $C_7$-$C_{10}$ aralkyl, wherein the alkyl, aryl, and aralkyl are optionally substituted with at least one selected from the group consisting of pyridinium*Y⁻, a halogen, S—$R_{14}$, O—$R_{14}$, CO—O$R_{14}$, O—CO—$R_{14}$, N$R_{14}R_{14}'$, CON$R_{14}R_{14}'$, and N$R_{14}$—CO—$R_{14}'$, and the pyridinium and aryl optionally substituted further with a $C_1$-$C_8$ alkyl, and $R_{14}$ and $R_{14}'$ are each independently H or a $C_1$-$C_{20}$ alkyl.

6. The electrode layer of claim 5, wherein, in formula (I), n is 1, $R_1$ and $R_2$ are H, A is a group of formula (IIa):

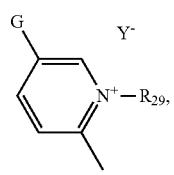

(IIa)

wherein

Y⁻ is

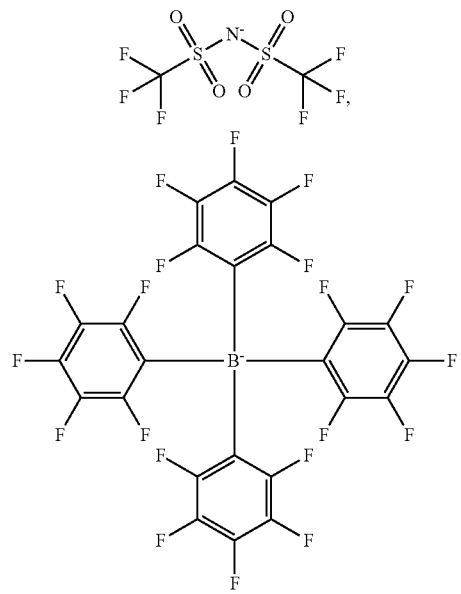

or I⁻, $R_{29}$ is a $C_1$-$C_{20}$ alkyl or a $C_7$-$C_{20}$ aralkyl,

G is —$R_{28}$—COOH, wherein $R_{28}$ is a direct bond,

D is a group of formula (III):

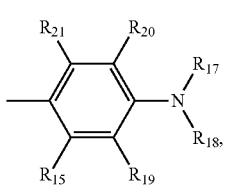

wherein $R_{17}$ and $R_{18}$ are each independently a $C_1$-$C_8$ alkyl, a $C_6$ aryl substituted with a $C_8$-$C_{20}$ aralkenyl, or a $C_4$-$C_{24}$ heteroaryl, or at least one selected from the group consisting of (i) $R_{17}$ and $R_{20}$ and (ii) $R_{18}$ and $R_{19}$ form, together with the N-atom $R_{17}$ and $R_{18}$ are attached to, a moiety selected from the group consisting of:

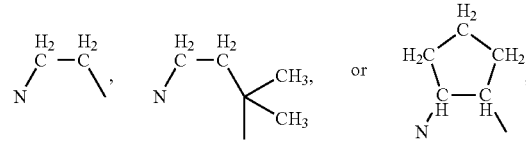

$R_{15}$ is H or $OR_{25}$, $R_{19}$, $R_{20}$, and $R_{21}$ are H, and $R_{25}$ is a $C_1$-$C_{14}$ alkyl or a $C_7$-$C_{10}$ aralkyl.

7. The electrode layer of claim 1, wherein the oxide semiconductor fine particles comprise at least one selected from the group consisting of $TiO_2$, $SnO_2$, $WO_3$, ZnO, $Nb_2O_5$, $Fe_2O_3$, $ZrO_2$, MgO, $WO_3$, ZnO, CdS, ZnS, PbS, $Bi_2S_3$, CdSe, and CdTe.

8. The electrode layer of claim 1, wherein the porous film is sensitized with one or more further dyes.

9. The electrode layer of claim 8, wherein the one or more further dyes are at least one selected from the group consisting of a metal complex dye and at least one organic dye selected from the group consisting of indoline, courmarin, cyanine, merocyanine, hemicyanine, methin, azo, quinone, quinonimine, diketo-pyrrolo-pyrrole, quinacridone, squaraine, triphenylmethane, perylene, indigo, xanthene, eosin, and rhodamine.

10. The electrode layer of claim 1, wherein the dye is adsorbed together with an additive.

11. The electrode layer of claim 10, wherein the additive is a co-adsorbent.

12. The electrode layer of claim 10, wherein the additive is at least one co-adsorbent selected from the group consisting of a steroid, a crown ether, a cyclodextrine, a calixarene, a polyethyleneoxide.

13. A photoelectric conversion device, comprising the electrode layer of claim 1.

14. A dye sensitized solar cell, comprising the photoelectric conversion device of claim 13.

15. A process for sensitizing a solar cell, the process comprising:

combining the electrode layer of claim 1 with a solar cell.

16. A compound, having a formula (I):

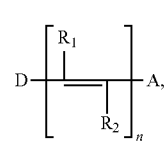

wherein n is 1-6, $R_1$ and $R_2$ are each independently H, a $C_1$-$C_{20}$ alkyl optionally interrupted with at least one selected from the group consisting of O, S, and $NR_{14}$, a $C_6$-$C_{20}$ aryl, a $C_4$-$C_{20}$ heteroaryl, or a $C_6$-$C_{20}$ aryl substituted with 1-3 $C_1$-$C_8$ alkyl groups, and additionally $R_1$ is optionally D, A is a group of formula (II) or (III):

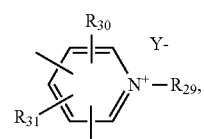

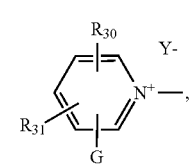

wherein $Y^-$ is an inorganic anion or an organic anion, $R_{29}$ is a $C_1$-$C_{20}$ alkyl optionally interrupted with at least one selected from the group consisting of O, S, and $NR_{14}$, a $C_6$-$C_{20}$ aryl, a $C_4$-$C_{20}$ heteroaryl, $O^-$, $OR_{32}$, a $C_7$-$C_{20}$ aralkyl, a $C_6$-$C_{20}$ aryl substituted with 1-3 $C_1$-$C_8$ alkyl groups, or a $C_7$-$C_{20}$ aralkyl substituted at the aryl with a 1-3 $C_1$-$C_8$ alkyl groups, $R_{30}$ is G, H, $OR_{32}$, a $C_1$-$C_{20}$ alkyl optionally interrupted with at least one selected from the group consisting of O, S, and $NR_{14}$, a $C_6$-$C_{20}$ aryl, a $C_4$-$C_{20}$ heteroaryl, or a $C_6$-$C_{20}$ aryl substituted with 1-3 $C_1$-$C_8$ alkyl groups, $R_{31}$ is H or

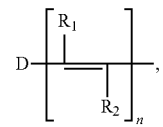

$R_{32}$ is a $C_1$-$C_{20}$ alkyl optionally interrupted with at least one selected from the group consisting of O, S, and $NR_{14}$, a $C_6$-$C_{20}$ aryl, a $C_4$-$C_{20}$ heteroaryl, or a $C_6$-$C_{20}$ aryl substituted with 1-3 $C_1$-$C_8$ alkyl groups, G is $—R_{28}—COOH$, $—R_{28}—COO^-Z^+$; $—R_{28}—SO_3^-H$, $—R_{28}—SO_3^-Z^+$; $—R_{28}—OP(O)(O^-Z^+)_2$, $—R_{28}—OP(O)(OH)_2$, or $—R_{28}—OP(O)(OH)O^-Z^+$, $R_{28}$ is a direct bond, a $C_1$-$C_{20}$ alkylene, a $C_2$-$C_4$ alkenylene, or a $C_6$-$C_{10}$ arylene, $Z^+$ is an organic or inorganic cation, each D is independently a group of formula (III) or (IV),

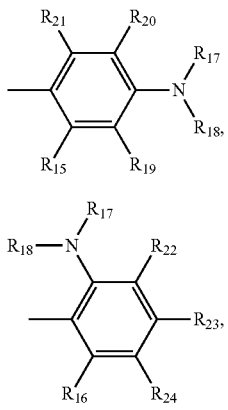

(III)

(IV)

wherein
- $R_{17}$ and $R_{18}$ are each independently an optionally substituted moiety selected from the group consisting of a $C_1$-$C_{20}$ alkyl, a $C_2$-$C_{20}$ alkenyl, a $C_2$-$C_{20}$ alkynyl, a $C_6$-$C_{20}$ aryl, a $C_4$-$C_{24}$ heteroaryl, a $C_7$-$C_{20}$ aralkyl, a $C_8$-$C_{20}$ aralkenyl, a $C_8$-$C_{20}$ aralkynyl, a $C_4$-$C_{20}$ cycloalkyl, a $C_5$-$C_{20}$ cycloalkenyl, and a $C_6$-$C_{20}$ cycloalkynyl, wherein the alkyl and cycloalkyl are optionally interrupted with at least one selected from the group consisting of O, S, and $NR_{14}$, or
- at least one selected from the group consisting of (i) $R_{17}$ and $R_{18}$, (ii) $R_{17}$ and $R_{22}$, (iii) $R_{17}$ and $R_{20}$, and (iv) $R_{18}$ and $R_{19}$ form together an optionally substituted 5-, 6-, or 7-membered ring,
- $R_{15}$, $R_{16}$, $R_{19}$, $R_{20}$, $R_{21}$, $R_{22}$, $R_{23}$, and $R_{24}$ are each independently H, $NR_{25}R_{26}$, $OR_{25}$, $SR_{25}$, $NR_{25}$—$NR_{26}R_{27}$, $NR_{25}$—$OR_{26}$, O—CO—$R_{25}$, O—CO—$OR_{25}$, O—CO—$NR_{25}R_{26}$, $NR_{25}$—CO—$R_{26}$, $NR_{25}$—CO—$OR_{26}$, $NR_{25}$—CO—$NR_{26}R_{27}$, CO—$R_{25}$, CO—$OR_{25}$, CO—$NR_{25}R_{26}$, S—CO—$R_{25}$, CO—$SR_{25}$, CO—$NR_{25}$—$NR_{26}R_{27}$, CO—$NR_{25}$—$OR_{26}$, CO—O—CO—$R_{25}$, CO—O—CO—$R_{25}$, CO—O—CO—$NR_{25}R_{26}$, CO—$NR_{25}$—CO—$R_{26}$, CO—$NR_{25}$—CO—$OR_{26}$, or an optionally substitute moiety selected from the group consisting of a $C_1$-$C_{20}$ alkyl, a $C_6$-$C_{20}$ aryl, a $C_2$-$C_{20}$ alkenyl, a $C_2$-$C_{20}$ alkynyl, a $C_6$-$C_{20}$ aryl, a $C_4$-$C_{20}$ heteroaryl, a $C_7$-$C_{20}$ aralkyl, a $C_8$-$C_{20}$ aralkenyl, a $C_8$-$C_{20}$ aralkynyl, a $C_4$-$C_{20}$ cycloalkyl, a $C_5$-$C_{20}$ cycloalkenyl, and a $C_6$-$C_{20}$ cycloalkynyl, wherein the alkyl and cycloalkyl are optionally interrupted with at least one selected from the group consisting of O, S, and $NR_{14}$,
- $R_{25}$, $R_{26}$, and $R_{27}$ are each independently H or an optionally substituted moiety selected from the group consisting of a $C_1$-$C_{20}$ alkyl, a $C_6$-$C_{20}$ aryl, a $C_2$-$C_{20}$ alkenyl, a $C_2$-$C_{20}$ alkynyl, a $C_6$-$C_{20}$ aryl, a $C_4$-$C_{20}$ heteroaryl, a $C_7$-$C_{20}$ aralkyl, a $C_8$-$C_{20}$ aralkenyl, a $C_8$-$C_{20}$ aralkynyl, a $C_4$-$C_{20}$ cycloalkyl, a $C_5$-$C_{20}$ cycloalkenyl, and a $C_6$-$C_{20}$ cycloalkynyl, wherein the alkyl and cycloalkyl are optionally interrupted with at least one selected from the group consisting of O, S, and $NR_{14}$, and
- $R_{14}$ is H or a $C_1$-$C_{20}$ alkyl.

\* \* \* \* \*